US010651072B2

(12) United States Patent
Berger et al.

(10) Patent No.: US 10,651,072 B2
(45) Date of Patent: May 12, 2020

(54) WAFER COMPOSITE AND METHOD FOR PRODUCING SEMICONDUCTOR COMPONENTS

(71) Applicant: Infineon Technologies AG, Neubiberg (DE)

(72) Inventors: Rudolf Berger, Regensburg (DE); Wolfgang Lehnert, Lintach (DE); Gerhard Metzger-Brueckl, Geisenfeld (DE); Guenther Ruhl, Regensburg (DE); Roland Rupp, Lauf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/264,265

(22) Filed: Jan. 31, 2019

(65) Prior Publication Data

US 2019/0244850 A1 Aug. 8, 2019

(30) Foreign Application Priority Data

Feb. 2, 2018 (DE) .......... 10 2018 102 408

(51) Int. Cl.
*H01L 21/683* (2006.01)
*H01L 21/02* (2006.01)
(Continued)

(52) U.S. Cl.
CPC .... *H01L 21/6835* (2013.01); *H01L 21/02002* (2013.01); *H01L 21/7813* (2013.01);
(Continued)

(58) Field of Classification Search
None
See application file for complete search history.

(56) References Cited

U.S. PATENT DOCUMENTS

| 2013/0119401 A1 | 5/2013 | D'Evelyn et al. |
| 2014/0159065 A1* | 6/2014 | Hu ............... H01L 33/0079 257/88 |

(Continued)

FOREIGN PATENT DOCUMENTS

| DE | 102013110126 A1 | 3/2014 |
| DE | 102013221788 A1 | 4/2015 |

(Continued)

OTHER PUBLICATIONS

Correia, S. A. G. D., et al., "Selective Laser Ablation of Dielectric Layers", Accessed online at https://studylib.net/doc/18769658/selective-laser-ablation-of-dielectric-layers on Jan. 31, 2019.

(Continued)

*Primary Examiner* — Asok K Sarkar
(74) *Attorney, Agent, or Firm* — Murphy, Bilak & Homiller, PLLC

(57) ABSTRACT

This application relates to a method for producing a semiconductor component, in which a wafer composite is provided. The wafer composite includes a donor substrate, an auxiliary substrate and a separation layer arranged between the auxiliary substrate and the donor substrate. The separation layer has a support structure and sacrificial material, which is formed laterally between elements of the support structure. The auxiliary substrate is separated from the donor substrate. The separation includes a selective removal of the sacrificial material in relation to the support structure.

28 Claims, 16 Drawing Sheets

(51) Int. Cl.
  *H01L 21/78* (2006.01)
  *H01L 29/66* (2006.01)
  *H01L 29/78* (2006.01)

(52) U.S. Cl.
  CPC .... *H01L 29/66712* (2013.01); *H01L 29/7813* (2013.01); *H01L 2221/6835* (2013.01); *H01L 2221/68318* (2013.01); *H01L 2221/68381* (2013.01)

(56) References Cited

U.S. PATENT DOCUMENTS

| | | | | |
|---|---|---|---|---|
| 2015/0371874 | A1* | 12/2015 | Bower | H01L 21/561 438/112 |
| 2016/0163535 | A1* | 6/2016 | Renauld | H01L 21/76254 438/455 |
| 2019/0164834 | A1* | 5/2019 | Or-Bach | H01L 27/0694 |
| 2019/0378719 | A1* | 12/2019 | Budd | H01L 21/6835 |

FOREIGN PATENT DOCUMENTS

DE  102015103323 A1  9/2016
WO  2016146584 A1  9/2016

OTHER PUBLICATIONS

Goela, Jitendra S., "CVD Growth and Characterization of β-SiC for IR Windows", Conference Proceedings Morton Advanced Materials, 1998.

Poulain, G., et al., "Laser Ablation Mechanism of Silicon Nitride Layers in a Nanosecond UV Regime", Energy Procedia, vol. 27, 2012, pp. 516-521.

Sakamoto, Jeffrey, et al., "Mo/Ti Diffusion Bonding for Making Thermoelectric Devices", NASA Tech Briefs, Jul. 2007, Accessed online at https://ntrs.nasa.gov/search.jsp?R=20100002847 on Jan. 31, 2019, p. 13.

* cited by examiner

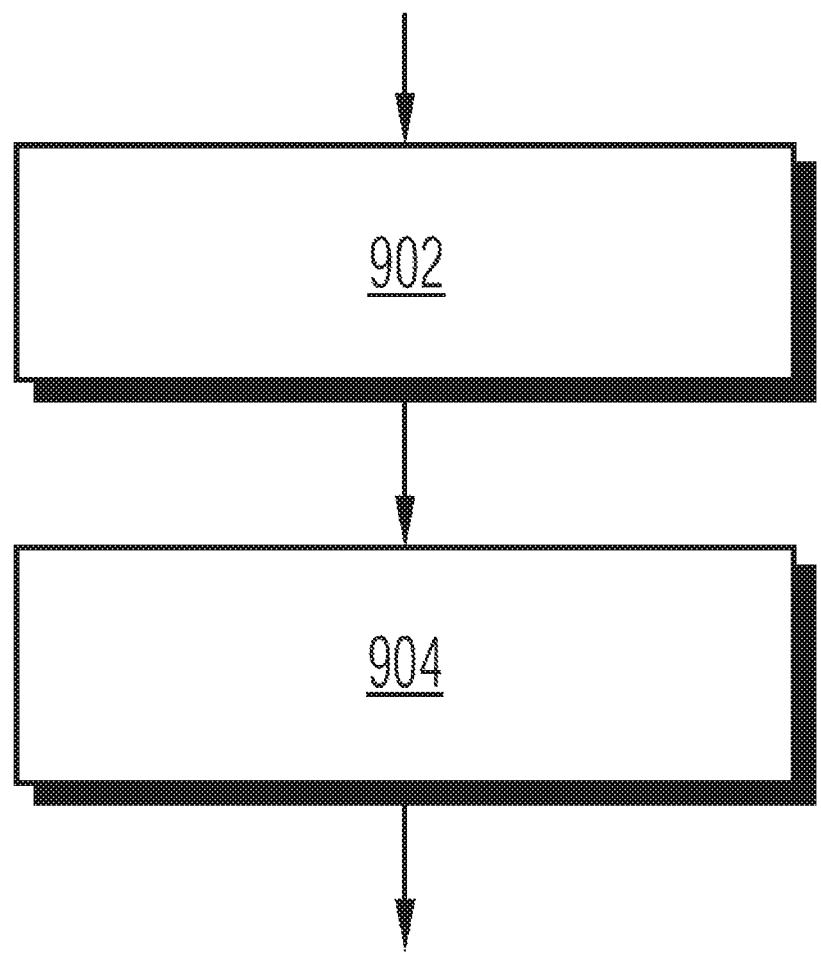

WAFER COMPOSITE AND METHOD FOR PRODUCING SEMICONDUCTOR COMPONENTS

BACKGROUND

Semiconductor components are typically manufactured in substrates that are cut from a cylindrical, monocrystalline crystal. As an alternative thereto, semiconductor components can also be manufactured in semiconductor layers that grow on a suitable substrate with a monocrystalline seed layer. Here, the substrate can be a constituent part of the finished component and/or it can be ablated, at least in part, in a polishing process before the component is completed.

There is a need for alternative methods that are able to cost-effectively provide monocrystalline semiconductor layers with a high crystal quality for the purposes of manufacturing semiconductor components.

SUMMARY

The present disclosure relates to a method for producing semiconductor components, in which a wafer composite is provided. The wafer composite comprises a donor substrate, an auxiliary substrate and a separation layer arranged between the auxiliary substrate and the donor substrate, wherein the separation layer has a support structure and sacrificial material, which is formed laterally between elements of the support structure. The auxiliary substrate is separated from the donor substrate, wherein the separation includes a selective removal of the sacrificial material in relation to the support structure.

Moreover, the present disclosure relates to a wafer composite comprising a donor substrate, an auxiliary substrate and a separation layer that connects the auxiliary substrate to the donor substrate. The separation layer has a support structure and sacrificial material, which is formed laterally between elements of the support structure.

Those skilled in the art will recognize additional features and advantages upon reading the following detailed description, and upon viewing the accompanying drawings.

BRIEF DESCRIPTION OF THE DRAWINGS

The accompanying drawings serve to afford an understanding of exemplary embodiments of the method and of the wafer composite, are included in the disclosure and form part thereof. The drawings merely illustrate exemplary embodiments and together with the description serve to elucidate them. Further exemplary embodiments and numerous advantages from among those intended are directly evident from the following detailed description. The elements and structures shown in the drawings are not necessarily illustrated in a manner true to scale with respect to one another. The same reference signs refer to identical or mutually corresponding elements and structures.

FIG. 1 shows a simplified flowchart for a method for producing semiconductor components according to one embodiment.

DETAILED DESCRIPTION

Figure 2A:
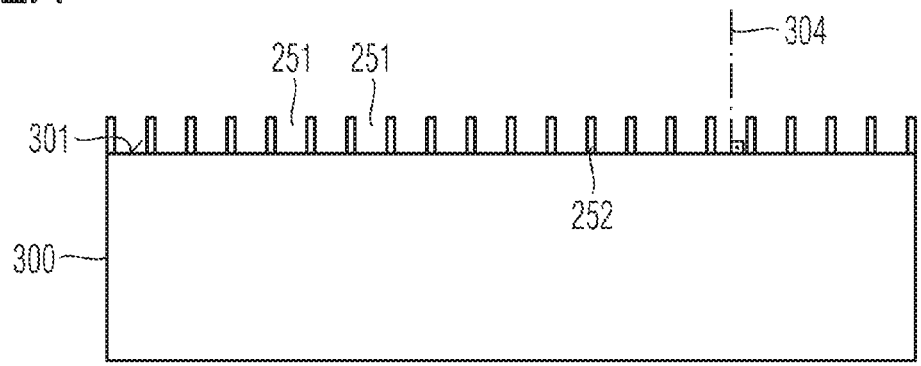
FIG. 2A shows a schematic vertical cross section through an auxiliary substrate after the formation of a support structure according to one embodiment.

In the following detailed description, reference is made to the accompanying drawings, which form part of the disclosure and in which specific exemplary embodiments are shown for illustration purposes. In this context, direction terminology such as "top side", "bottom", "front side", "rear side", "at the front", "at the back", etc. relates to the orientation of the figures being described. Since the component parts of the exemplary embodiments can be positioned in different orientations, the direction terminology serves merely for elucidation and is in no way limiting.

It is self-evident that other exemplary embodiments also exist, and structural or logical changes can be made in the process without deviating from the scope defined by the patent claims. In this respect, the description of the exemplary embodiments is not limiting. In particular, elements of exemplary embodiments described below can be combined with elements of other described exemplary embodiments, provided that nothing to the contrary is evident from the context.

In so far as the terms "have", "contain", "encompass", "comprise" and the like are used, they are open terms which indicate the presence of the stated elements or features, but do not exclude the presence of further elements or features. The indefinite articles and the definite articles encompass both the plural and the singular, provided that nothing to the contrary is clearly evident from the context.

According to FIG. 1, a method for producing a semiconductor component comprises the provision (902) of a wafer composite, which has a donor substrate, an auxiliary substrate and a separation layer arranged between the auxiliary substrate and the donor substrate. The separation layer has a support structure and sacrificial material, which is formed laterally between elements of the support structure. Further, the method comprises separating (904) the auxiliary substrate from the donor substrate, wherein the separation includes a selective removal of the sacrificial material in relation to the support structure. The method can be performed in the specified sequence.

According to one embodiment, the donor substrate comprises a first crystalline semiconductor material and the auxiliary substrate comprises a second crystalline semiconductor material. The second crystalline semiconductor material can have the same elements as the first crystalline semiconductor material, wherein the first and the second semiconductor material differ from one another by way of at least one of the following properties: doping, crystal type, polytype or the presence or absence of grain boundaries. According to one embodiment, the first crystalline semiconductor material and the second crystalline semiconductor material are formed with the same elements, for example formed from the same elements. The donor substrate and the auxiliary substrate can be semiconductor wafers with approximately the same diameter.

The separation layer is aligned parallel to a main surface of the auxiliary substrate. Directions parallel to the main surface are lateral directions. A normal to the main surface of the auxiliary substrate defines a vertical direction.

The elements of the support structure are spaced apart from one another in the lateral direction and can have the same vertical extent. The sacrificial material is formed between respectively adjacent elements of the support structure and can directly adjoin the elements of the support structure. Portions of the sacrificial material between the elements of the support structure can have the same vertical extent as the elements of the support structure. The sacrificial material can consist of a substance that is solid and/or viscous at 25° C. or can be formed using such a substance.

The sacrificial material arranged laterally next to the elements of the support structure increases the mechanical stability of the separation layer and facilitates multifaceted processing within the scope of forming functional elements in a component layer, which is formed either in the donor substrate or in an epitaxial layer that is grown on the donor substrate or on a seed layer formed from a part of the donor substrate. By way of example, the formation of the functional elements can include horizontal splitting of the donor substrate and/or growing an epitaxial layer on the side of the donor substrate. By way of example, mechanical forces can act on the wafer composite when splitting the donor substrate, said forces possibly at least partly destroying a support structure that has not been reinforced by the sacrificial material.

Then again, the support structure can be destroyed by simple means after the removal of the sacrificial material, as a result of which the auxiliary substrate and component layer can be separated from one another with little impairment of the integrity of component layer and auxiliary substrate, for example by the action of moderate mechanical forces, by way of ultrasound, by way of wet chemical etching, by shattering due to frost and/or the like.

Hence, the method facilitates, inter alia, the production of electronic components and micromechanical systems in epitaxial layers which grow on thin monocrystalline seed layers obtained from a donor substrate.

Further auxiliary layers can be formed below and/or on the separation layer, for example auxiliary layers that facilitate and/or simplify bonding or adhesive bonding of a part of a wafer composite comprising the donor substrate to a part of the wafer composite comprising the auxiliary substrate. As an alternative or in addition thereto, a plurality of functional layers can be formed, said plurality of functional layers being permanently connected to the component layer within the scope of the method and forming functional elements of the finalized semiconductor components, for example electrode layers or connection layers.

FIGS. 2A to 2E relate to a method according to one embodiment, in which a separation layer 250 with a support structure 252 is formed on an auxiliary substrate 300.

A support structure layer is applied to a main surface 301 of an auxiliary substrate 300 and structured, for example by means of a photolithographic method in which a support structure 252 emerges from the support structure layer, said support structure covering first portions of the main surface 301 and being absent above second portions of the main surface 301. In addition to exposure and development of a photoresist layer applied to the support structure layer, the photolithographic method can also comprise the transfer of the pattern projected into the photoresist layer into the support structure layer by means of a directed etching method, e.g. plasma etching.

The auxiliary substrate 300 can be formed from a material having the same coefficient of thermal expansion as a donor substrate 100, which is described below with reference to FIG. 2D, or the coefficient of thermal expansion of said material only deviates very slightly, for example by less than 1 ppm, from the coefficient of thermal expansion of the material of the donor substrate 100.

The auxiliary substrate 300 and the donor substrate 100 can consist of the same semiconductor material or of different semiconductor materials. By way of example, the auxiliary substrate 300 and the donor substrate 100 are based on two different crystalline semiconductor materials with identical atomic constituents, which differ from one another in respect of the crystal form, i.e., in respect of the crystal type, the polytype, the doping and/or the absence or presence of grain boundaries, with such grain boundaries existing between crystallites in a polycrystalline semiconductor material and such grain boundaries not existing in a monocrystalline semiconductor material.

By way of example, both the donor substrate 100 and the auxiliary substrate 300 consist of the same semiconductor material, for example silicon (Si), germanium (Ge), silicon germanium (SiGe), silicon carbide (SiC) or a compound semiconductor, e.g., gallium nitride (GaN) or gallium arsenide (GaAs), wherein the donor substrate 100 is monocrystalline and the auxiliary substrate 300 can be either monocrystalline or polycrystalline.

By way of example, the donor substrate 100 is made of monocrystalline SiC of a first polytype and the auxiliary substrate 300 is made of monocrystalline SiC of the first polytype or of a different polytype or made of polycrystalline SiC. According to one embodiment, the donor substrate 100 is formed from weakly n-doped monocrystalline silicon carbide, or consists thereof, and the auxiliary substrate 300 is formed by undoped monocrystalline silicon carbide, or consists thereof, wherein the specific electric resistance of the auxiliary substrate 300 can be at least $10^5$ Ωcm, e.g., at least $10^6$ Ωcm, for example.

A normal 304 on the main surface 301 defines a vertical direction. Directions parallel to the main surface 301 are horizontal directions.

Chambers 251, which are connected to one another through gaps between the elements in the support structure 252, are formed between laterally adjacent elements of the support structure 252. Lateral width and spacing of the support structures 252 are dimensioned in such a way that, firstly, a sufficient stability of the wafer composite 900 for the subsequent processing and, secondly, a subsequent simple separation of the wafer composite along the separation layer are ensured. The support structure 252 can occupy at most 50% of the entire first main surface 301, for example at most 10%. A vertical extent of the support structure 252 is in a range from at least 20 nm to at most 5 μm, for example, e.g., in a range from at least 50 nm to at most 1 μm.

By way of example, the support structure 252 comprises a multiplicity of elements separated from one another in the horizontal direction. The elements can be embodied in the style of ribs, the first horizontal extent of which is greater than a second horizontal extent, which is orthogonal to the first horizontal extent, and the longitudinal axes of which can be parallel to one another or radial to the horizontal center point of the main surface 301. According to another embodiment, the support structure 252 has column-like elements with two approximately equal extents along two orthogonal horizontal directions. The elements can also be angled structures and/or the support structure 252 can have a plurality of differently formed elements. Adjacent chambers 251 are connected to one another by way of voids between adjacent elements of the support structure 252. Along an outer edge of the separation layer 250, the support structure 252 can have a support ring 2521, which closes off the chambers 251 to the outside. The support ring 2521 can be closed, i.e., it can completely surround the chambers 251, or it can have voids. According to one embodiment, the support ring 2521 can surround the chambers 251 in a frame-like manner, e.g., in a ring-like manner, in a plan view of the separation layer.

The material of the support structure 252 can be temperature-resistant at least up to a maximum process temperature which is reached by the time of the subsequent separation of the component layer from the auxiliary substrate 300.

According to one embodiment, the support structure 252 can comprise silicon nitride, for example, as a main constituent or it can consist of silicon nitride. In this embodiment, the donor substrate 100 can be traced back to a SiC crystal, in particular. Here, and below, a component "consists" of a material if said component contains only the material, with the exception of production-related impurities.

According to another embodiment, the donor substrate 100 is based on a different semiconductor crystal to SiC, for example based on crystalline Si, Ge, SiGe, GaN and/or GaAs, wherein the support structure 252 may have silicon nitride, silicon oxide and/or crystalline and/or polycrystalline aluminum oxide as a main constituent.

The chambers 251 in the separation layer 250 are at least partly filled with sacrificial material 255, wherein the sacrificial material 255 is a substance that is solid or viscous at 25° C. and can leave bubbles and/or voids filled with a gas or gas mixture, e.g., ambient air, within the chambers 251. Provided voids 256 remain in the chambers 251, these can be spaced apart from a plane defined by the upper edge of the support structure 252.

The sacrificial material 255 is formed from a different material to the support structure 252 and/or it can be removed with high selectivity in relation to the material of the support structure 252. According to one embodiment, the sacrificial material 255 can be etched by wet chemical processes with a high degree of selectivity in relation to the material of the support structure 252. By way of example, the support structure 252 consists of silicon nitride and the sacrificial material 255 is based on a silicon oxide, for example a silicon oxide arising from the deposition of TEOS (tetraethyl orthosilicate).

According to another embodiment, the sacrificial material 255 can be decomposed at a temperature that is lower than the melting temperature or the decomposition temperature of the support structure 252. By way of example, the support structure 252 has silicon nitride or silicon oxide as a main constituent while the sacrificial material 255 can be based on elemental carbon, e.g., graphite, or on a carbon compound.

According to other embodiments, either the material of the support structure 252 or the sacrificial material 255 is silicon oxide and the respective other material is silicon, for example polycrystalline silicon. By way of example, amorphous silicon as sacrificial material 255 can be combined with a support structure 252 that consists of, or contains, silicon nitride or silicon oxide. Amorphous aluminum oxide, which is etchable in hydrogen fluoride, in particular, as sacrificial material 255 can be combined with a support structure 252 that contains, or consists of, crystalline aluminum oxide, for example polycrystalline aluminum oxide.

The sacrificial material 255 can be deposited in such a way that it at least partly covers the support structure 252, the sidewalls thereof in particular. A component of the sacrificial material 255 deposited above the support structure 252 can be removed by a mechanical method, for example by chemical mechanical polishing (CMP).

Figure 2B:
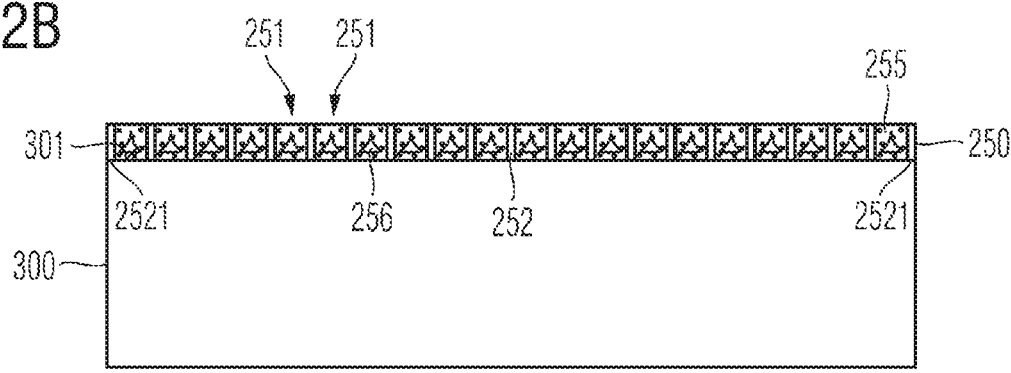
FIG. 2B shows a schematic vertical cross section through the auxiliary substrate according to FIG. 2A after the application of sacrificial material.

FIG. 2B shows the auxiliary substrate 300 with the separation layer 250, in which the sacrificial material 255 reaches up to the upper edge of the support structure 252 and virtually completely fills the chambers 251. Voids 256 in the sacrificial material 255 are formed exclusively or predominantly at a distance from the upper edge of the separation layer 250.

An auxiliary layer 260 can be applied to the planarized surface of separation layer 250 and sacrificial material 255.

Figure 2C:
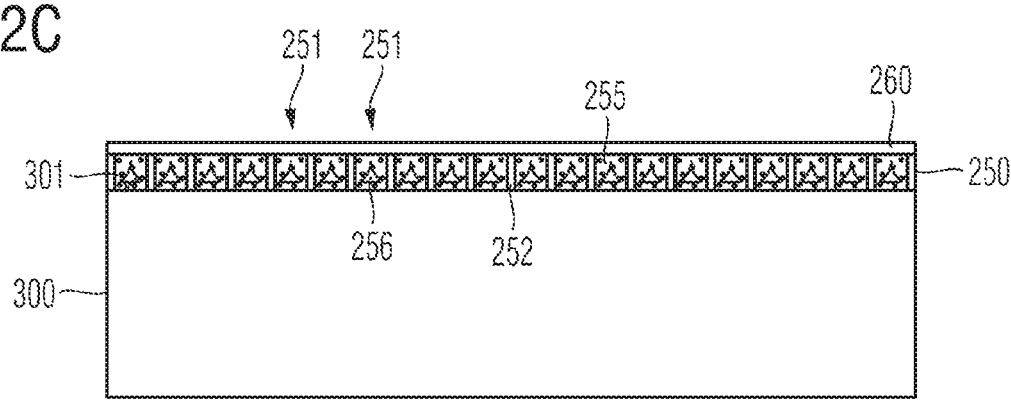
FIG. 2C shows a schematic vertical cross section through the auxiliary substrate according to FIG. 2B after the application of an auxiliary layer on the support structure.

The auxiliary layer 260 illustrated in FIG. 2C closes off the chambers 251, which are completely or at least 90% filled with the sacrificial material 255, in the vertical direction. The auxiliary layer 260 can consist of the same material as the support structure 252, e.g., silicon nitride, or it can consist of a different material, e.g., a metal.

A donor substrate 100 is connected to the auxiliary substrate 300, for example by means of bonding, via the auxiliary layer 260 and the separation layer 250. Functional elements 190 of semiconductor components are formed in a component layer 110, which emerged from the donor substrate 100 or which was produced with the aid thereof. Forming the component layer 110 may comprise splitting a main part of the donor substrate 100 from a seed layer and/or growing an epitaxial layer, e.g., on a seed layer that was split from the donor substrate 100.

The chambers 251 are opened from the direction of the component layer 110 or the auxiliary substrate 300 and the sacrificial material 255 or breakdown products of the sacrificial material 255 are removed through the openings at a suitable time during the processing of the functional elements, for example before the formation of doped regions and/or conductive structures in the component layer 110, after the formation of the doped regions, after the formation of metallization layers or at any other time within the scope of this processing. An auxiliary carrier 400 can be fastened, for example by means of adhesive bonding or bonding, on or over a front side 106 of the component layer 110 after the removal of the sacrificial material 255.

Figure 2D:
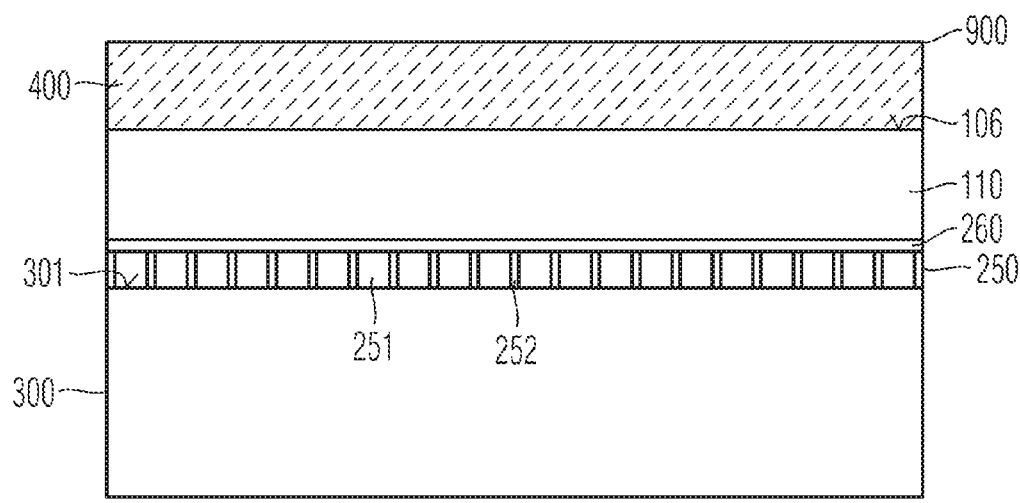
FIG. 2D shows a schematic vertical cross section through a wafer composite having the auxiliary substrate according to FIG. 2C.

FIG. 2D shows a wafer composite 900 with the auxiliary substrate 300 of FIG. 2C, with the component layer 110 connected to the auxiliary substrate 300 via the auxiliary layer 260 and the separation layer 250, and with the auxiliary carrier 400 fastened on the front side 106 on the front side of the component layer 110. The sacrificial material of FIG. 2C has been at least largely removed. The chambers 251 are predominantly empty or filled with a gas or gas mixture, for instance ambient air and/or a process gas.

Figure 2E:
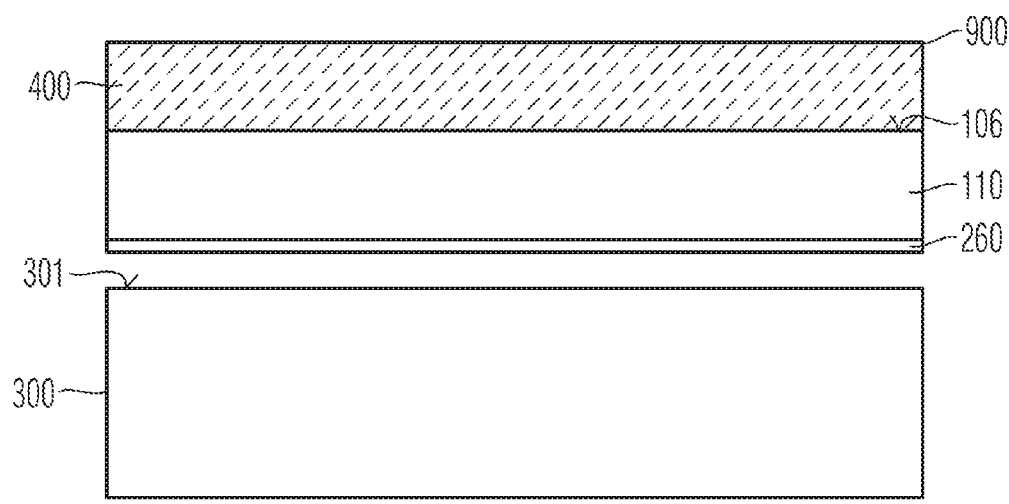
FIG. 2E shows a schematic vertical cross section through the wafer composite according to FIG. 2D after the removal of the support structure.

FIG. 2E shows the separation of the auxiliary substrate 300 from the wafer composite 900 by a method which exploits the existence of the chambers 251 and which selectively removes and/or destroys the support structure 252 in relation to the auxiliary substrate 300 and the donor substrate 100. By way of example, chucks can be fastened on opposite sides of the wafer composite 900 and can be twisted in relation to one another, with the occurring shearing forces shearing the elements of the support structure 252. In addition or as an alternative thereto, the wafer composite 900 can be loaded with pressure or tension until the elements of the support structure 252 yield.

After separating the auxiliary substrate 300, the main surface 301 thereof can be subjected to a cleaning process, for example a wet etching process, for the purposes of removing residues of the separation layer 250 and/or to a polishing process for the purposes of reestablishing a surface quality that is necessary for forming a support structure 252 as shown in FIG. 2A.

FIGS. 3A to 3F relate to a method which combines an early removal of sacrificial material 255 prior to the formation of functional elements with a wafer splitting method.

A defect layer 170 is produced at a distance from a first substrate surface 101 of a donor substrate 100, for example by implanting light ions 175, e.g. hydrogen and/or helium, through the first substrate surface 101.

Figure 3A:
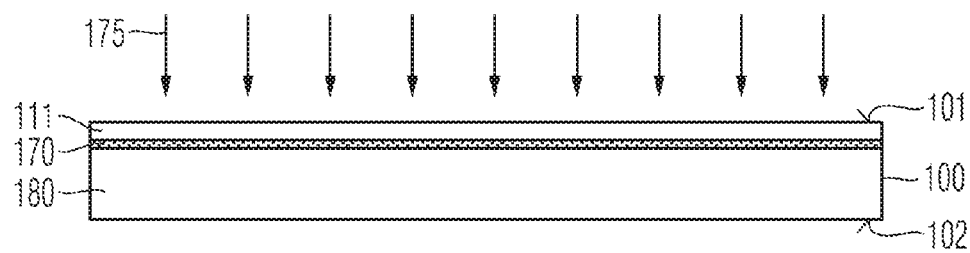
FIG. 3A shows a schematic vertical cross section through a donor substrate when producing a defect layer for the purposes of illustrating a method for producing semiconductor components according to one embodiment.

FIG. 3A shows the donor substrate 100 with a horizontal defect layer 170, which may extend over the entire cross-sectional surface of the donor substrate 100. The portion of the donor substrate 100 between the first substrate surface 101 and the defect layer 170 remains largely untouched by the implantation and subsequently forms a seed layer 111 as a basis for a component layer 110.

The donor substrate 100 is a flat disk made of a monocrystalline semiconductor material, e.g., silicon (Si), germanium (Ge), silicon germanium (SiGe), silicon carbide (SiC), or a monocrystalline compound semiconductor, e.g., gallium nitride (GaN) or gallium arsenide (GaAs).

The defect layer 170 separates the seed layer 111 from a main part 180 of the donor substrate 100, wherein the main part 180 comprises at least 50% of the donor substrate 100. The defect layer 170 can have a high density of crystallographic defects, e.g., imperfections, interstitial atoms and, in the case of implantation with hydrogen, complexes formed by hydrogen atoms bound to imperfections. The distance between the defect layer 170 and the substrate surface 101 lies in a range of 1 μm to 20 μm, for example.

After the defect layer 170 has been formed, the donor substrate 100 is permanently connected to an auxiliary substrate 300 via a separation layer 250 and, for example, via an auxiliary layer 260.

According to one embodiment, a first substrate surface 101 of the donor substrate 100 is brought directly into contact with an exposed surface of the auxiliary layer 260 and both surfaces are permanently and irreversibly connected to one another by bonding. Expressed differently, the auxiliary substrate 300 and the donor substrate 100 can no longer be separated from one another without destroying the separation layer 250, the auxiliary substrate 300 and/or the donor substrate 100.

In the case of bonding (direct bonding), the adhesion between two contacting and sufficiently planar surfaces is based on van der Waals forces, hydrogen bonds and/or chemical bonds of metallic, ionic or covalent nature, wherein this can relate to the surfaces of two layers made of the same material or made of two different materials. Bonding can comprise a pressing together of the two surfaces, a thermal treatment of the contacting surfaces or a combination of both (fusion bonding, thermocompressive bonding, bonding by atomic rearrangement). Alternatively, bonding can comprise anodic bonding, in which an electric field is applied over the connection surface during heat treatment and/or in which a current flows through the connection surface. By way of example, a further adhesion layer made of the material of the auxiliary layer 260 can be applied to the substrate surface 101 prior to bonding such that the bonding connects two surfaces made of the same material.

According to another embodiment, the donor substrate 100 is adhesively bonded to the auxiliary layer 260, wherein an adhesive layer is initially applied to the first substrate surface 101 of the donor substrate 100 or to the exposed surface of the auxiliary layer 260 or, in two partial layers, to both the first substrate surface 101 and the exposed surface of the auxiliary layer 260.

Figure 3B:
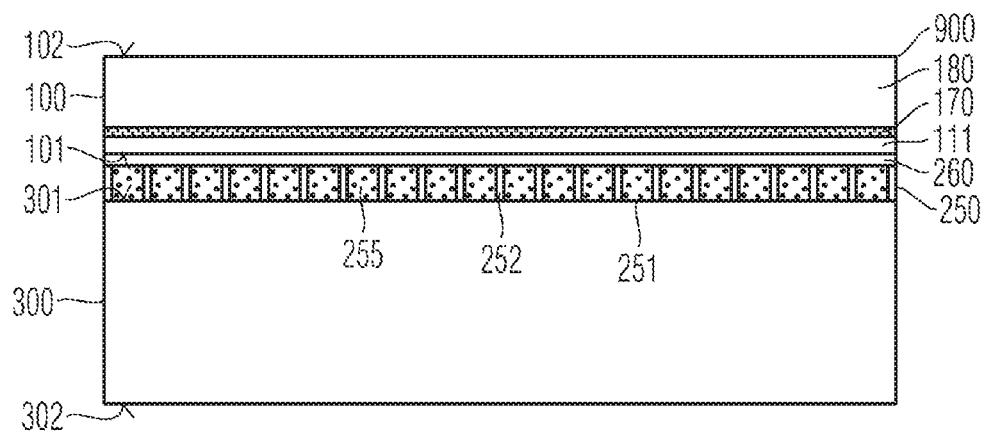
FIG. 3B shows a schematic vertical cross section through a wafer composite, comprising an auxiliary substrate connected to the donor substrate according to FIG. 3A by way of a separation layer.

FIG. 3B shows a wafer composite 900 with the donor substrate 100 that is connected to the auxiliary substrate 300 via the auxiliary layer 260 and via the separation layer 250.

The auxiliary substrate 300 can consist of a material that has the same coefficient of thermal expansion as the donor substrate 100, or the coefficient of thermal expansion of which only deviates very slightly, for example by less than 1 ppm, from the coefficient of thermal expansion of the donor substrate 100.

The auxiliary substrate 300 and the donor substrate 100 can consist of the same semiconductor material or of different semiconductor materials. By way of example, the auxiliary substrate 300 and the donor substrate 100 are based on a crystal structure made of the same elements, i.e., with identical atomic constituents, and they differ in respect of the absence or presence of grain boundaries, in respect of the crystal morphology and/or in respect of doping. By way of example, both the donor substrate 100 and the auxiliary substrate 300 are formed from the same crystalline semiconductor material, e.g., SiC, GaN or GaAs, wherein the donor substrate 100 is monocrystalline and the auxiliary substrate 300 can be monocrystalline or polycrystalline. By way of example, the donor substrate 100 is made of monocrystalline SiC of a first crystal type and of a first polytype and the auxiliary substrate 300 is made of monocrystalline SiC of the first polytype or a different polytype and of the first crystal type or of a different crystal type.

According to one embodiment, the donor substrate 100 is monocrystalline SiC and the auxiliary substrate 300 is a semi-insulating, monocrystalline SiC wafer of the same polytype, wherein the specific electric resistance of a semi-insulating SiC wafer can be at least $10^5$ Ωcm, e.g., at least $10^6$ Ωcm.

The auxiliary substrate 300 can have the same horizontal cross-sectional form as the donor substrate 100, wherein a diameter of the auxiliary substrate 300 can correspond to the diameter of the donor substrate 100 or can be greater than the diameter of the donor substrate 100. By way of example, the auxiliary substrate 300 can be a circular disk with a diameter of 76.2 mm, 100 mm, 125 mm, 127 mm, 150 mm, 200 mm or 300 mm. A thickness of the auxiliary substrate 300 between the first main surface 301 on the front side and a rear side 302 on the rear side can lie in a range from 300 μm to 1200 μm, for example.

The main part 180 of the donor substrate 100 is separated from the seed layer 111 along a split plane that extends parallel to, and through, the defect layer 170. The separation can comprise a heat treatment at a temperature at which the hydrogen atoms implanted in the defect layer 170 are rearranged and form pores in the donor substrate 100 such that the main part 180 of the donor substrate 100 can be split from the seed layer 111 by the action of a moderate mechanical force. The chambers 251 of the separation layer 250 can be filled during the entire splitting process such that the separation layer 250 has a high mechanical stability and the integrity of the separation layer 250 during the processing is ensured.

According to another embodiment, the main part 180 of the donor substrate 100 can be separated along a horizontal layer, modified by laser conditioning, between the main part 180 and the seed layer 111 by virtue of a polymer film being applied to the main part 180 after the laser conditioning and thermomechanical stresses subsequently being produced, said stresses splitting the donor substrate 100 along the modified horizontal layer.

Figure 3C:
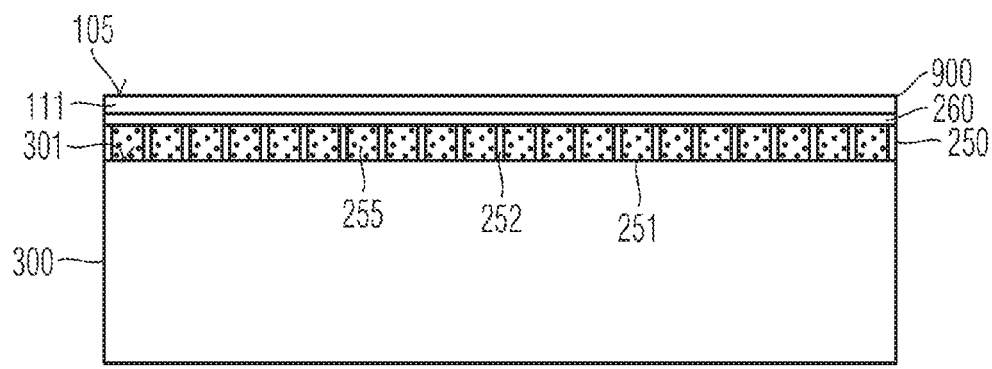
FIG. 3C shows a schematic vertical cross section through the wafer composite according to FIG. 3B after separating the main part of the donor substrate from the seed layer along the defect layer.

FIG. 3C shows the remaining seed layer 111, which can be bonded and/or adhesively bonded directly onto the auxiliary layer 260. By way of example, a vertical extent of the seed layer 111 can lie in a range from 500 nm to 5 μm. Splitting off the main part 180 is implemented after connecting the donor substrate 100 to the auxiliary substrate

300, as indicated in FIG. 3B, and prior to separating a component layer 110 comprising the seed layer 111 from the auxiliary substrate 300.

The chambers 251 in the separation layer 250 are opened in the vertical direction. By way of example, an etching mask is formed on the seed layer 111 by way of a photolithographic method and vertical openings 265 that extend through the seed layer 111 and the auxiliary layer 260 are etched by means of the etching mask and a directed etching method, for example by means of reactive ion beam etching.

Figure 3D:
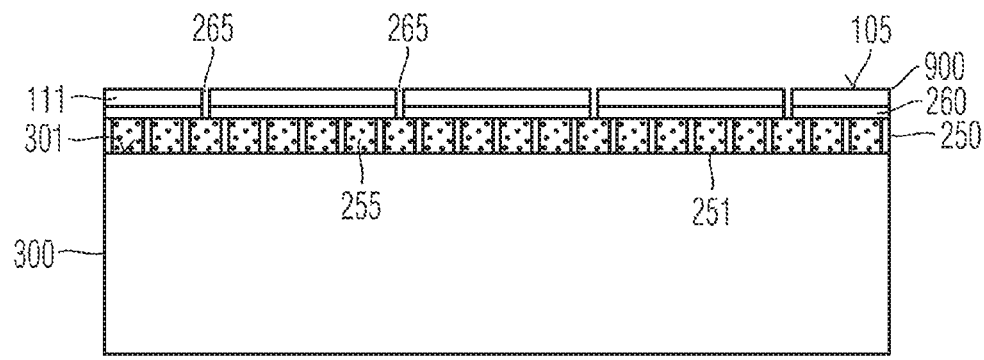
FIG. 3D shows a schematic vertical cross section through the wafer composite according to FIG. 3C after the exposure of the sacrificial material.

FIG. 3D shows the vertical openings 265 that extend from the front side of the wafer composite 900 through the seed layer 111 and through the auxiliary layer 260 and that expose the sacrificial material 255 in the chambers 251. Horizontal cross-sectional areas of the vertical openings 265 can be polygons, e.g., rectangles and/or squares with rounded or chamfered corners, and/or ovals, e.g., ellipses and/or circles, which can be arranged in a regular pattern at approximately the same distance from one another. According to other embodiments, the vertical openings 265 are long trenches with a horizontal width and a horizontal length orthogonal to the horizontal width, said horizontal length being at least ten times larger than the horizontal width. According to another embodiment, strip-shaped vertical openings 265 that extend transversely to one another can form a grid.

The sacrificial material 255 is dissolved and/or decomposed, for example in thermal or chemical fashion by means of wet etching or by means of dry etching in a reducing or oxidizing atmosphere. Breakdown products of the sacrificial material 255 are removed to the outside via the vertical openings 265. In order to ensure a reliable supply of solvents or etching means and/or a reliable removal of breakdown products or the solution, a minimum width of the vertical openings 265 is at least 50 nm for thermal decomposition of the sacrificial material 255 and at least 100 nm for chemical breakdown and/or dissolution of the sacrificial material 255.

Figure 3E:
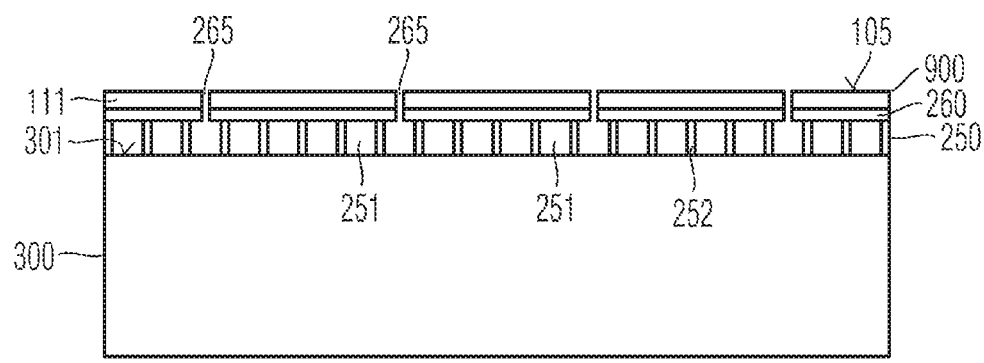
FIG. 3E shows a schematic vertical cross section through the wafer composite according to FIG. 3D after the removal of the sacrificial material.

FIG. 3E shows the separation layer 250 after the removal of the sacrificial material. Since the chambers 251 are connected to one another by way of lateral voids in the support structure 252, the sacrificial material 255 is also removed from chambers 251 that do not directly adjoin vertical openings 265.

An epitaxial layer 112 is grown on the seed layer 111, said epitaxial layer, possibly together with the seed layer 111, forming a component layer 110. Within the scope of epitaxy, atoms of the semiconductor material are supplied to the seed layer 111, said atoms accumulating on the exposed process surface 105 on the front side of the seed layer 111 and, in the process, adopting and continuing the crystal structure of the seed layer 111. Epitaxy can be preceded by a thermal treatment in a hydrogen-containing environment, allowing the seed layer 111 to close the vertical openings 265. A maximum width of the vertical openings 265 is 1500 nm, for example 500 nm, in order to prevent the chambers 251 from being filled with the material of the epitaxial layer 112.

Figure 3F:
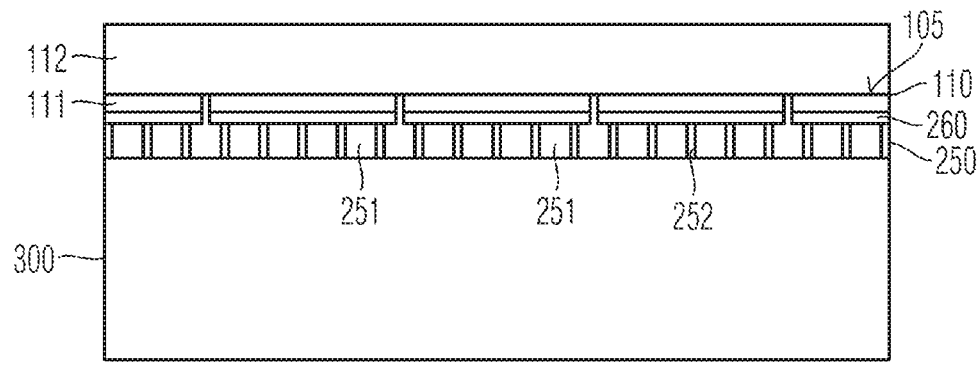
FIG. 3F shows a schematic vertical cross section through the wafer composite according to FIG. 3E after the formation of a component layer on the basis of the seed layer.

FIG. 3F shows the epitaxial layer 112 which, at least in the vertical projection (i.e., in the regions outside of the vertical openings) of the undisturbed seed layer 111, has hardly any crystal defects. Manufacturing semiconductor components can be continued according to the description of FIGS. 2D and 2E with the formation of functional elements in the component layer 110.

FIGS. 4A to 4E relate to the opening of chambers 251 in a separation layer 250 at a time when the component layer 110 has the final layer thickness.

Figure 4A:
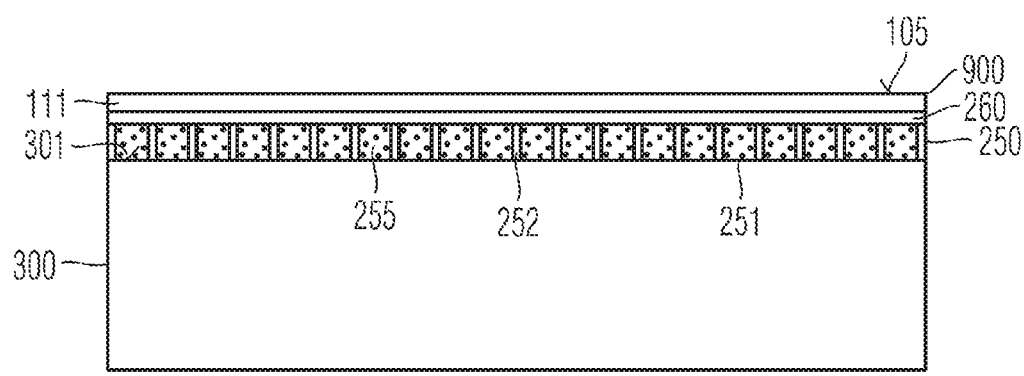
FIG. 4A shows a schematic vertical cross section through a wafer composite for the purposes of illustrating a method for producing semiconductor components according to another embodiment.

The wafer composite 900 shown in FIG. 4A comprises a seed layer 111, embodied as described with reference to FIGS. 3A to 3C, on a layer structure comprising an auxiliary layer 260 and a separation layer 250, the chambers 251 of which are filled with sacrificial material 255.

Similar to what was described in relation to FIG. 3D, an epitaxial layer 112 is grown on the seed layer 111, with the difference that the chambers 251 are still filled with the sacrificial material 255.

Figure 4B:
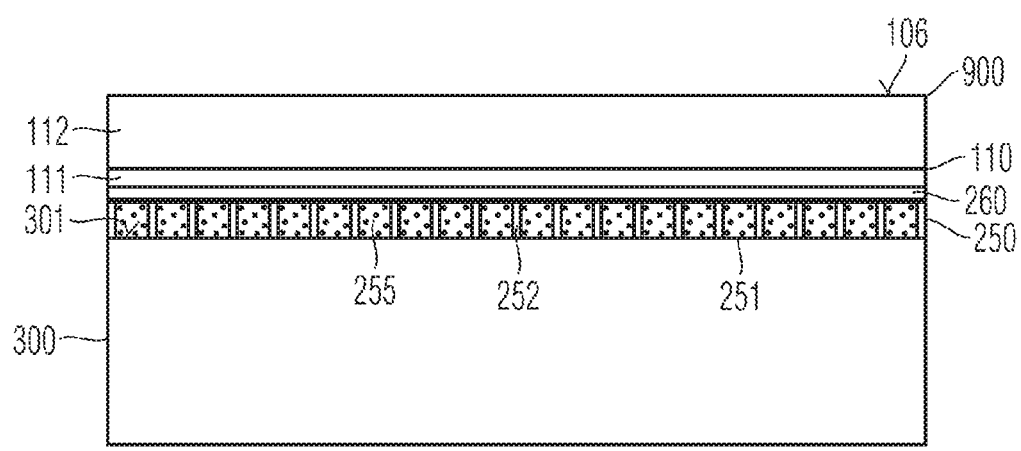
FIG. 4B shows a schematic vertical cross section through the wafer composite according to FIG. 4A after the growth of an epitaxial layer on the seed layer.

FIG. 4B shows a component layer 110 with the final layer thickness between a front side 106 and the auxiliary layer 260, said component layer having been formed from the epitaxial layer 112 and the seed layer 111. At least doped regions 195 of functional elements 190 are formed in the component layer 110.

Figure 4C:
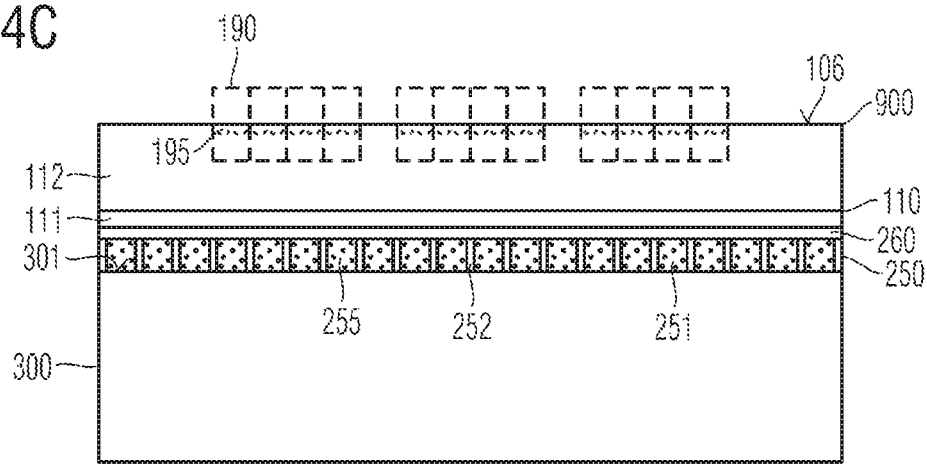
FIG. 4C shows a schematic vertical cross section through the wafer composite according to FIG. 4B after the formation of functional elements in a component layer formed from the epitaxial layer and the seed layer.

FIG. 4C shows doped regions 195 of functional elements 190 of semiconductor components, formed in the component layer 110. Further partial structures of functional elements, such as gate electrodes, isolator structures, connection lines and metallic electrode structures, can be formed on and over the front side surface 106 of the component layer 110.

Deep openings 266, which reach into the separation layer 250 and open the chambers 251, are introduced through the component layer 110 and, where necessary, through element layers embodied on the front side 106 of the component layer 110. Thermal or chemical breakdown products of the sacrificial material 255 are removed through the deep openings 266.

Figure 4D:
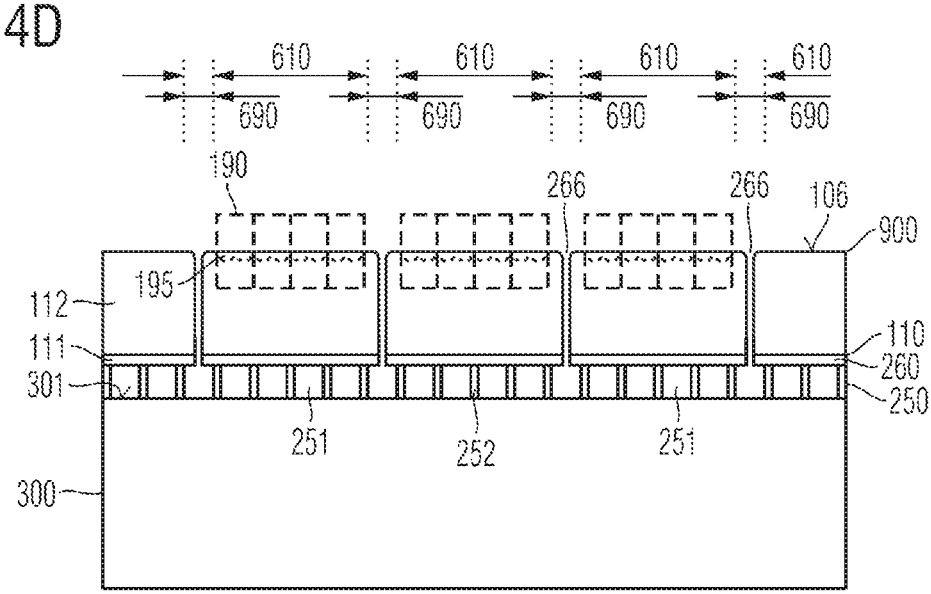
FIG. 4D shows a schematic vertical cross section through the wafer composite according to FIG. 4C after the exposure of the sacrificial material by way of deep openings and the removal of the sacrificial material.

FIG. 4D shows the emptied chambers 251 of the separation layer 250 and the deep openings 266, which reach up to the chambers 251 through the component layer 110 and through the auxiliary layer 260.

According to one embodiment, the deep openings 266 are formed in a kerf region 690 of the component layer 110, wherein the kerf region 690 has no functional elements of the finalized semiconductor elements and/or wherein separation trenches and/or sawing traces are formed in the kerf region 690, said separation trenches and/or sawing traces separating adjacent semiconductor dies 610 of the semiconductor components to be manufactured from one another. The deep openings 266 can be sealed prior to further processing, e.g., by deposition and back formation of an auxiliary material.

Figure 4E:
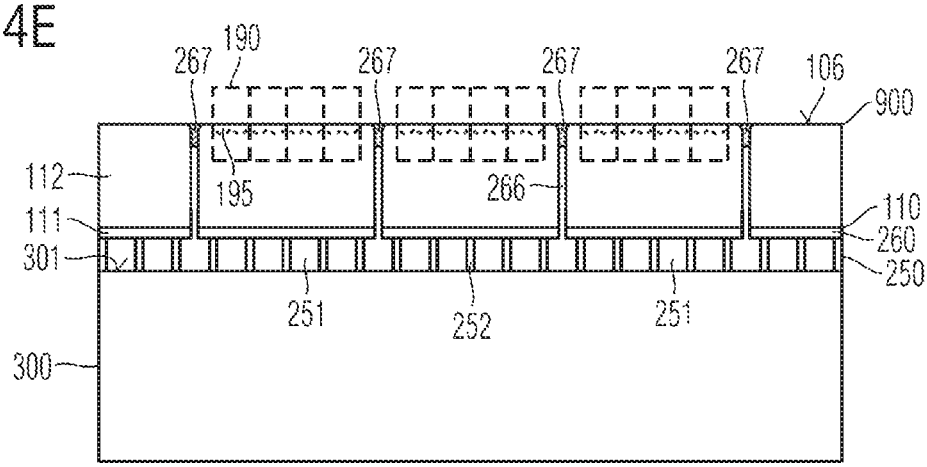
FIG. 4E shows a schematic vertical cross section through the wafer composite according to FIG. 4D after the closure of the deep openings.

FIG. 4E shows plugs 267 formed from the auxiliary material, said plugs each being laid on at least an upper portion of the deep openings 266. The auxiliary material can comprise polycrystalline silicon, silicon nitride and/or silicon oxide.

Figure 5A:
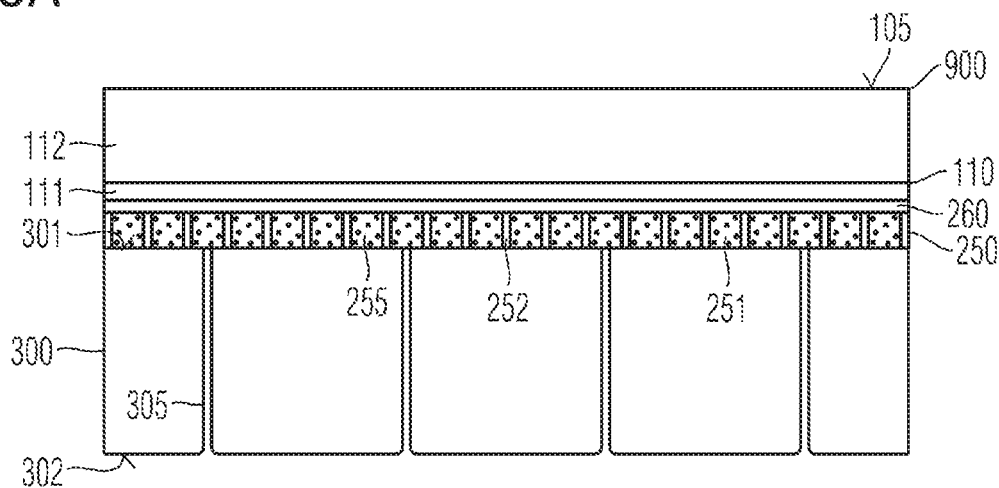
FIG. 5A shows a schematic vertical cross section through a wafer composite for the purposes of illustrating a method for producing semiconductor components according to a further embodiment.
Figure 5B:
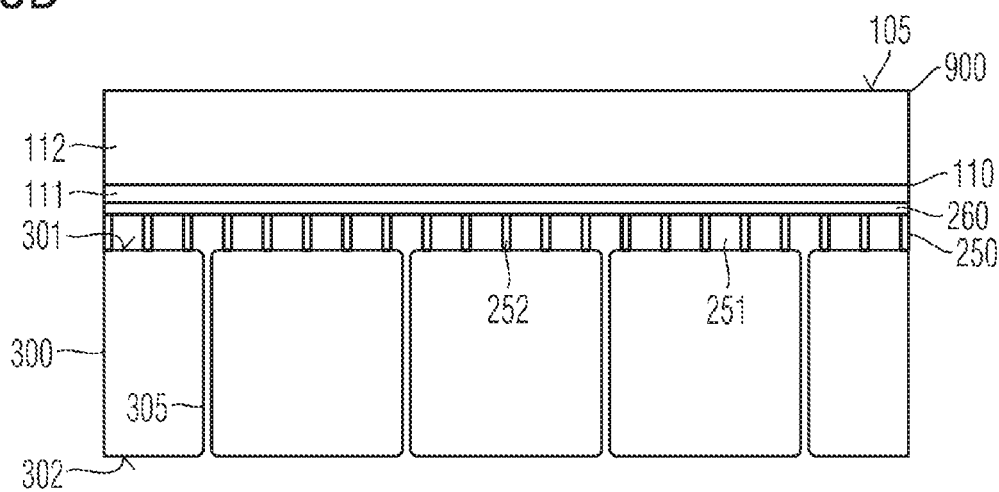
FIG. 5B shows a schematic vertical cross section through the wafer composite according to FIG. 5A after the removal of the sacrificial material.
Figure 6A:
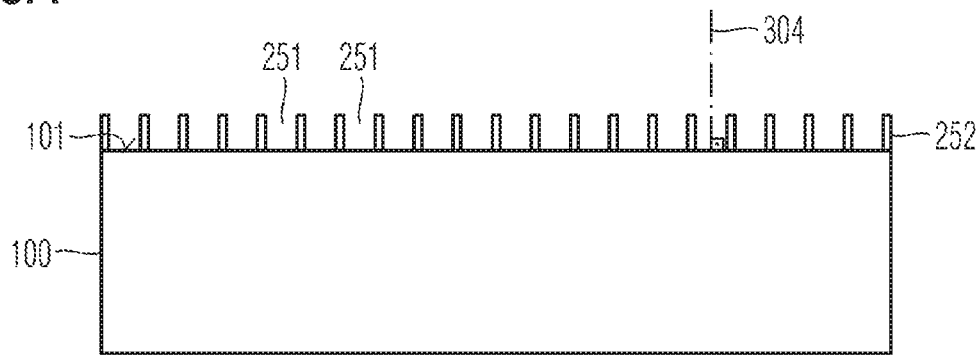
FIG. 6A shows a schematic vertical cross section through a donor substrate after the formation of a support structure for the purposes of illustrating a method for producing semiconductor components according to a further embodiment.
Figure 6B:
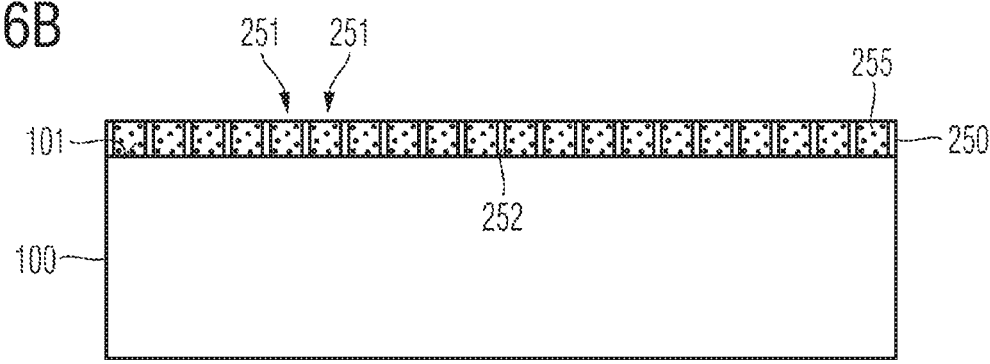
FIG. 6B shows a schematic vertical cross section through the donor substrate according to FIG. 6A after the application of sacrificial material.
Figure 6C:
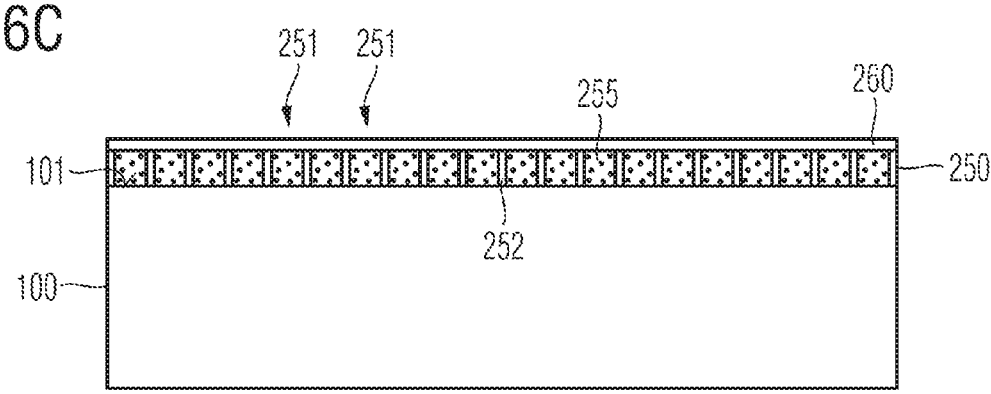
FIG. 6C shows a schematic vertical cross section through the donor substrate according to FIG. 6B after the application of an auxiliary layer on a separation layer having the support structure.
Figure 6D:
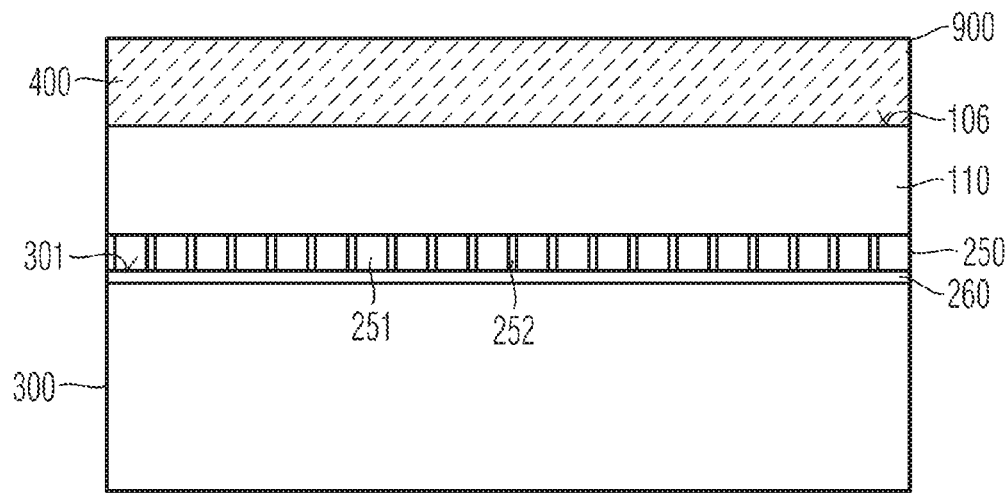
FIG. 6D shows a schematic vertical cross section through a wafer composite with the donor substrate according to FIG. 6C after the removal of the sacrificial material and after the application of an auxiliary carrier.
Figure 6E:
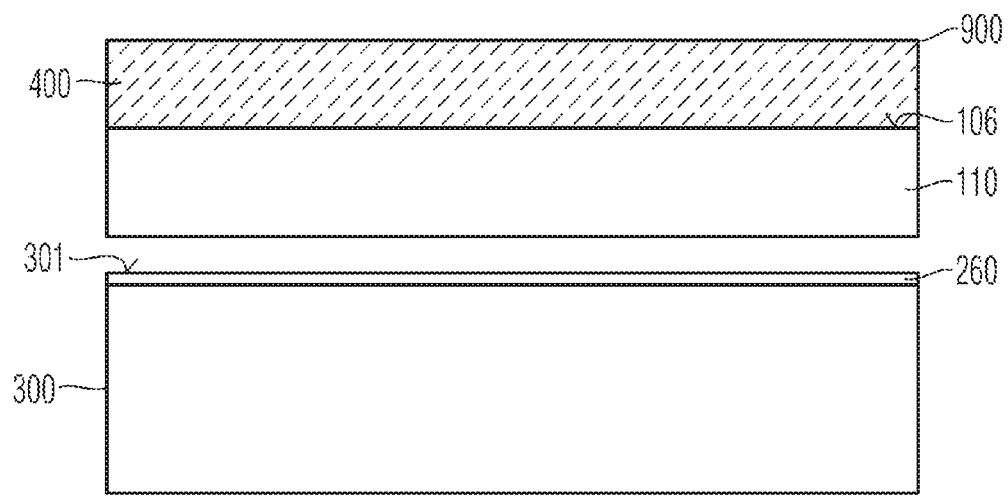
FIG. 6E shows a schematic vertical cross section through the wafer composite according to FIG. 6D after the removal of the support structure.

FIGS. 5A and 5B relate to an opening of the chambers 251 from the direction of the auxiliary substrate 300.

FIG. 5A shows an auxiliary substrate 300, into which auxiliary openings 305 have been introduced from the rear side 302, said auxiliary openings reaching as far as the main surface 301 and exposing the chambers 251. The statements made in relation to the vertical openings 265 with reference to FIG. 3D apply analogously in relation to the horizontal cross-sectional area and arrangement of the auxiliary openings 305. The vertical auxiliary openings 305 can also comprise long trenches, the horizontal length of which exceeds a horizontal width by at least a factor of 10. According to other embodiments, the vertical auxiliary openings 305 can have long trenches extending transversely to one another, said long trenches forming a grid.

The vertical auxiliary openings 305 can be formed at any time. Since the auxiliary substrate 300 is reusable, the vertical auxiliary openings 305 could already have been formed at the time of connection to the donor substrate 100, wherein the vertical auxiliary openings 305 can be intermittently sealed by, or filled with, a second sacrificial material.

The sacrificial material 255 or the breakdown products thereof are removed through the vertical auxiliary openings 305 at a process time after the formation of the seed layer 111, for example after the formation of the epitaxial layer 112.

FIG. 5B shows the completely or predominantly empty chambers 251 after the removal of the sacrificial material via the vertical auxiliary openings 305, which extend from the rear side 302 into the auxiliary substrate 300.

The method shown in FIGS. 6A to 6E differs from the method of FIGS. 2A to 2E by the formation of the support structure 252 on a substrate surface 101 of the donor substrate 100 instead of on a main surface 301 of an auxiliary substrate 300. After removal and/or destruction of the layer structure 252, a possibly envisaged auxiliary layer 260 remains on the main surface 301 of the auxiliary substrate 300. The material of the donor substrate 100 can be exposed on the rear side of the component layer 110.

FIGS. 7A to 7F relate to a method in which, already at an early stage, a metallization layer 270 is formed on the donor substrate 100 and/or initially formed on the auxiliary substrate 300 and subsequently transferred to the component layer 110.

Figure 7A:
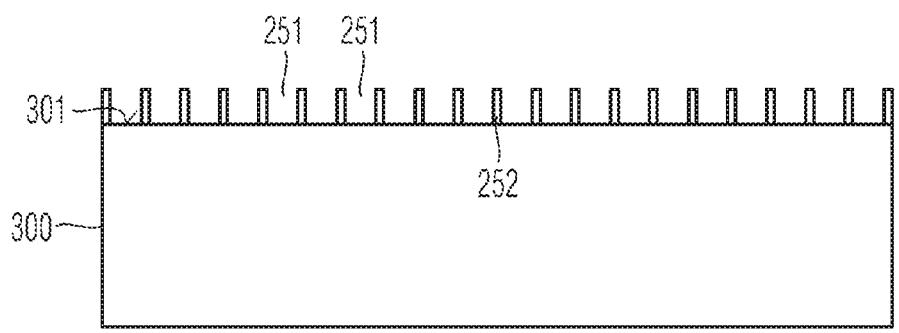
FIG. 7A shows a schematic vertical cross section through an auxiliary substrate after the formation of a support structure for the purposes of illustrating a method for producing semiconductor components according to a further embodiment.

FIG. 7A shows an auxiliary substrate 300, on the main surface 301 of which a support structure 252 is formed as described above. Chambers 251 between elements of the support structure 252 are filled at least in part by sacrificial material 255 and an auxiliary layer 260 can be deposited on the upper edge of the support structure 252, said auxiliary layer covering the chambers 251 in the vertical direction. A metallization layer 270 can be deposited on the auxiliary layer 260. As an alternative or in addition thereto, the auxiliary layer 260 is already formed as a metallic layer and it can subsequently adopt the function of the metallization layer 270. According to another embodiment, the metallization layer 270 can be formed on a first substrate surface 101 of the donor substrate 100.

Figure 7B:
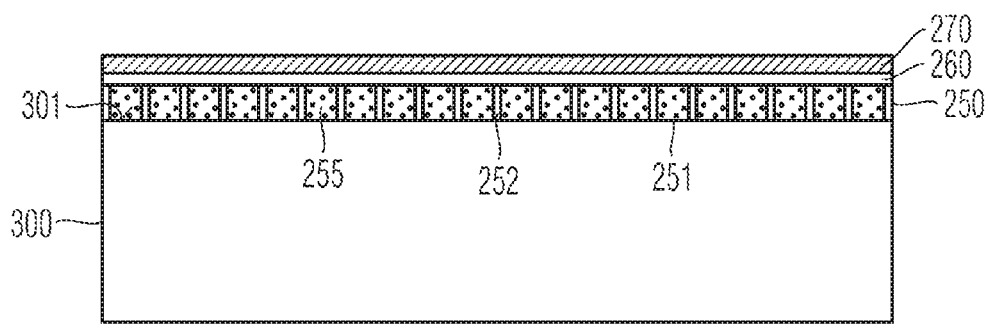
FIG. 7B shows a schematic vertical cross section through the auxiliary substrate according to FIG. 7A after the application of a metallization layer on a layer structure having the support structure of FIG. 7A.

FIG. 7B relates to an embodiment in which the metallization layer 270 is formed on the side of the auxiliary substrate 300 in addition to the auxiliary layer 260. By way of example, the metallization layer 270 can comprise high temperature resistant materials such as molybdenum, for example. A layer thickness of the metallization layer 270 can lie in a range from 10 nm to 2 μm, for example from 50 nm to 1 μm.

The donor substrate 100 is connected to the auxiliary substrate 300 via the metallization layer 270, for example by means of bonding. A defect layer can be formed in the donor substrate 100, as described in relation to FIG. 3A.

Figure 7C:
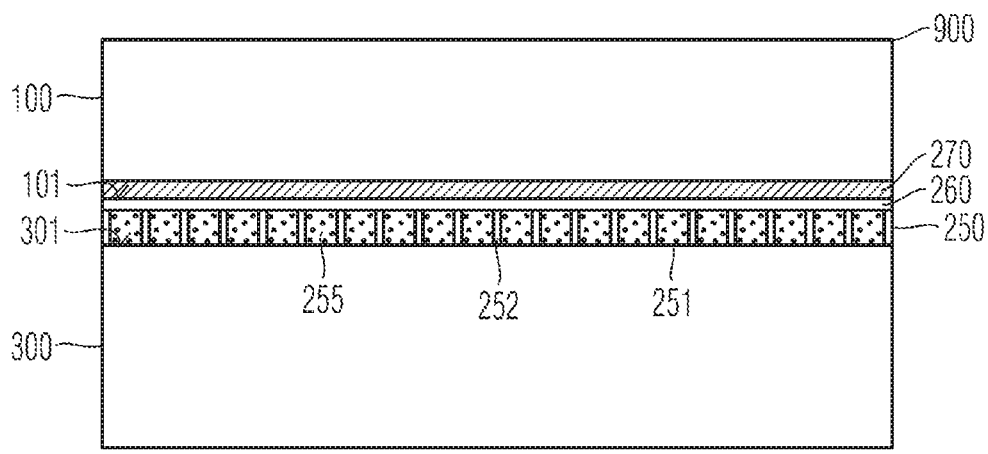
FIG. 7C shows a schematic vertical cross section through a wafer composite with a donor substrate connected to the auxiliary substrate of FIG. 7B by way of the metallization layer.

FIG. 7C shows a wafer composite 900 with the donor substrate 100 bonded onto the metallization layer 270. A main part is split off from the donor substrate 100 in accordance with one of the above-described methods.

Figure 7D:
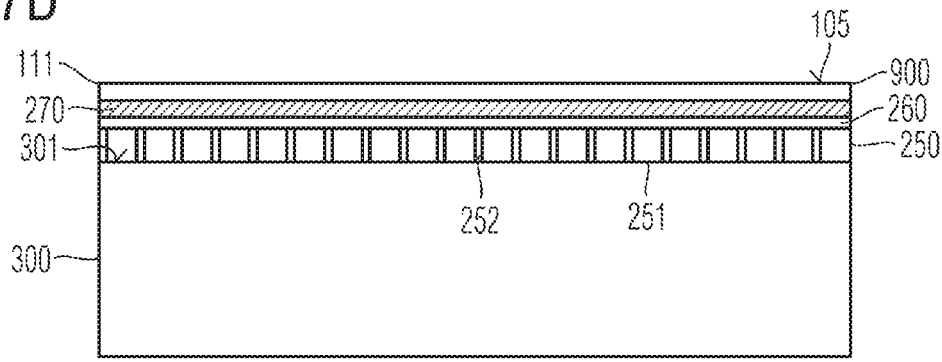
FIG. 7D shows a schematic vertical cross section through the wafer composite according to FIG. 7C after the formation of a seed layer from part of the donor substrate.

FIG. 7D shows a seed layer 111 that remains from the donor substrate 100, said seed layer being connected to the auxiliary substrate 300 via the metallization layer 270, the auxiliary layer 260 and the separation layer 250. An epitaxial layer 112 is grown on an exposed process surface 105 of the seed layer 111 and at least doped regions of functional elements 190 are formed in the component layer 110 that is formed by the epitaxial layer 112 and the seed layer 111.

Further functional layers, for example metallization layers and the insulation layers separating the metallization layers from one another and from parts of the component layer 110 can be provided on or over a front side 106 of the component layer 110. An auxiliary carrier 400 is connected in reversible fashion to the component layer 110 on the front side of the component layer 110. By way of destroying the separation layer 250, the auxiliary substrate 300 is separated from a part of the wafer composite 900 comprising the component layer 110 and the auxiliary carrier 400.

Figure 7E:
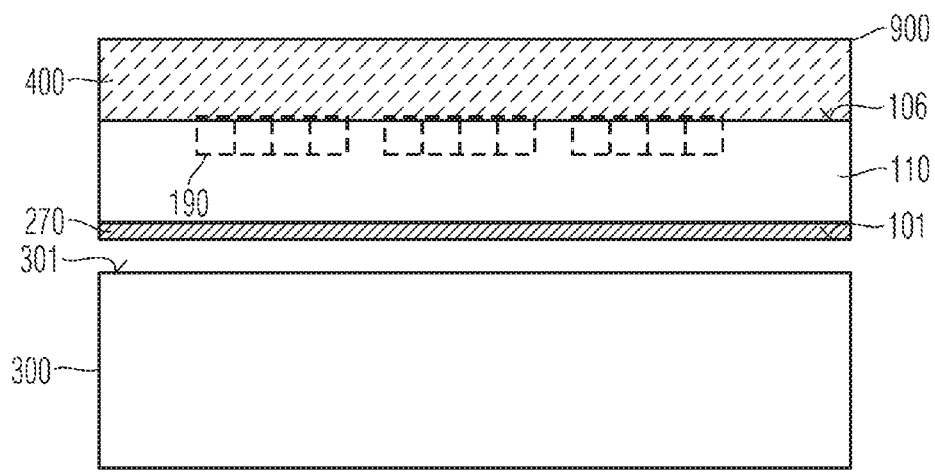
FIG. 7E shows a schematic vertical cross section through the wafer composite according to FIG. 7D after the separation of part of the wafer composite according to FIG. 7D, which includes the metallization layer, from the auxiliary substrate.

As shown in FIG. 7E, the metallization layer 270 remains on the side of the component layer 110 in the process.

Figure 7F:
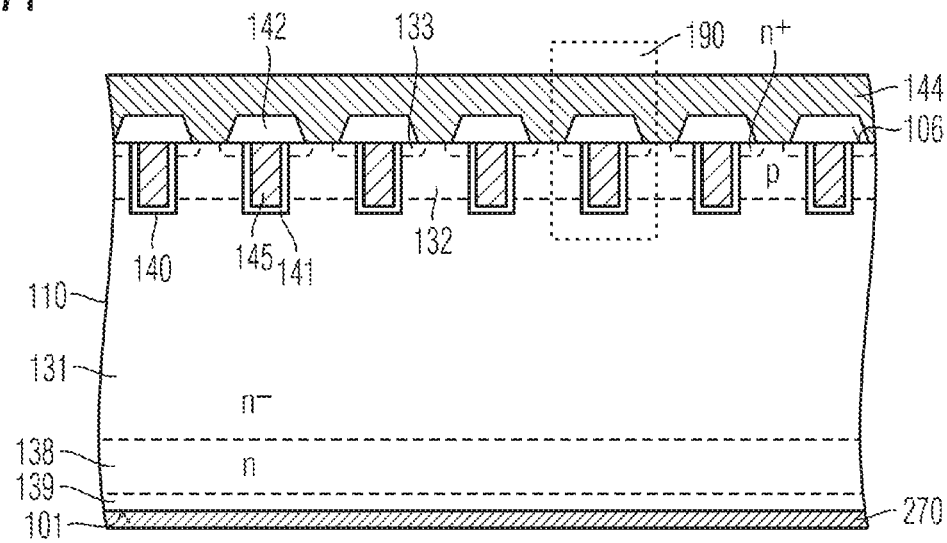
FIG. 7F shows a schematic vertical cross section of a portion of a component layer of the wafer composite of FIG. 7E, separated from the auxiliary substrate, according to an exemplary embodiment that relates to the manufacture of vertical power semiconductor components.

FIG. 7F shows details of the component layer 110 and of functional elements 190 in the component layer 110 according to one exemplary embodiment, which relates to vertical power semiconductors with a load current flow from one component side to the other.

In this exemplary embodiment, the functional elements 190 comprise transistor cells with source regions 133 formed along the front side 106 and body regions 132, which separate the source regions 133 from a weakly doped drift zone 131 formed in the component layer 110. The transistor cells further comprise gate structures 140 with a gate electrode 145 and a gate dielectric 141 that separates the gate electrode 145 from the semiconductor material of the component layer 110. The gate structures 140 can extend into the component layer 110 from the front side 106 or can be formed above the front side 106 and outside of the component layer 110. An intermediate layer dielectric 142 separates the gate electrode 145 from a front side metallization layer 144.

The metallization layer 270 can directly adjoin a highly doped contact layer 139 in the component layer 110. A field stop layer 138, whose dopant concentration is higher than in the drift zone 131 but lower than in the contact layer 139, can be formed between the highly doped contact layer 139 and the weakly doped drift zone 131. The transistor cells can be n-channel transistor cells. The highly doped contact layer 139 can have the conductivity type of the source regions 133 or the conductivity type of the body regions 132. By way of example, the field stop layer 138 can be formed by varying the in-situ doping during epitaxy.

Figure 8A:
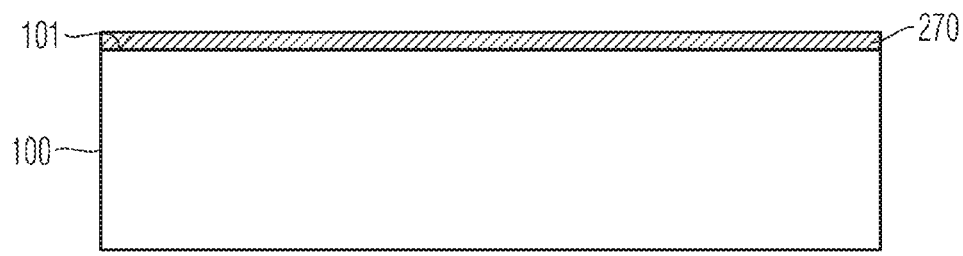
FIG. 8A shows a schematic vertical cross section of a donor substrate after the application of a metallization layer for the purposes of illustrating a method for producing semiconductor components according to another embodiment.
Figure 8B:
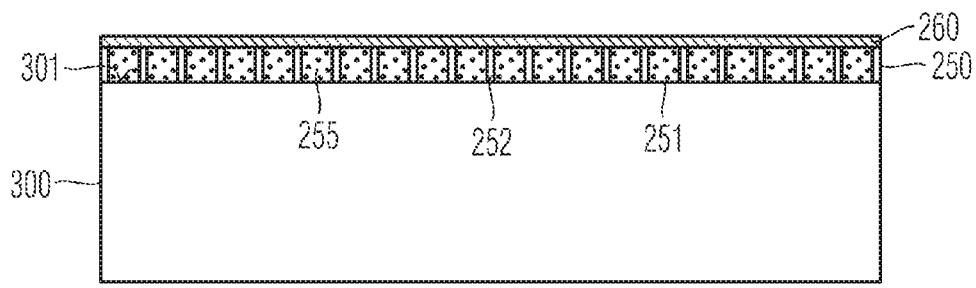
FIG. 8B shows a schematic vertical cross section of an auxiliary substrate with a metallic auxiliary layer applied to a separation layer.
Figure 8C:
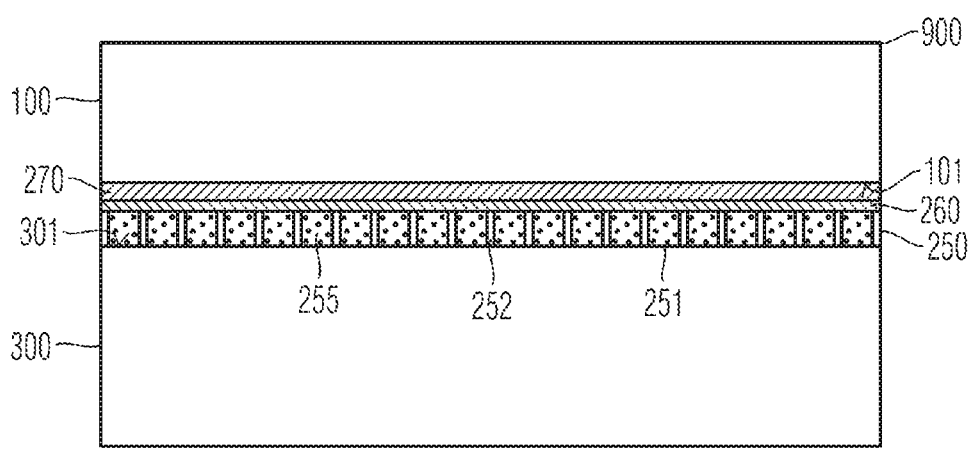
FIG. 8C shows a schematic vertical cross section of a wafer composite having the donor substrate according to FIG. 8A and the auxiliary substrate according to FIG. 8B after the bonding of the two metallic layers.

The method as shown in FIGS. 8A to 8C relates to connecting the donor substrate 100 and the auxiliary substrate 300 with the aid of bonding two metallic layers.

FIG. 8A shows a metallization layer 270 applied to a first substrate surface 101 of a donor substrate 100.

FIG. 8B shows a separation layer 250 that is applied to a main surface 301 of an auxiliary substrate 300, and an auxiliary layer 260 that is applied to the separation layer 250 and that is embodied as a metallic layer. The auxiliary layer 260 and the metallization layer 270 can be made of the same material or of different materials. The metallization layer 270 on the donor substrate 100 is connected to the metallic auxiliary layer 260 on the auxiliary substrate 300, for example by metallic bonding.

FIG. 8C shows the wafer composite 900 that arose by way of the metallic bonding. The method can be continued as described in FIGS. 7D to 7F. When the auxiliary substrate 300 is separated, both the metallic auxiliary layer 260 and the metallization layer 270 remain on the rear side of the component layer 110 as part of the rear side metallization, similar to what is shown in FIG. 7E.

Figure 9A:
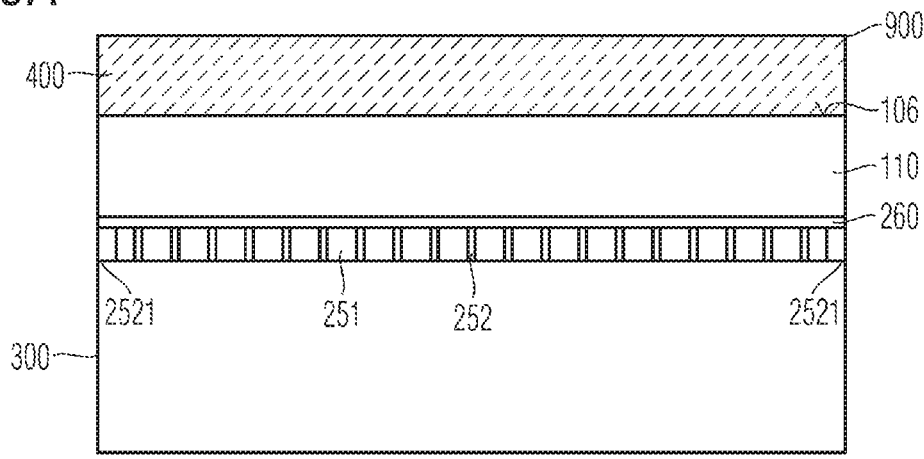
FIG. 9A shows a schematic vertical cross section through a wafer composite having a separation layer, from which sacrificial material was removed, for the purposes of illustrating a separation method according to a further embodiment.
Figure 9B:
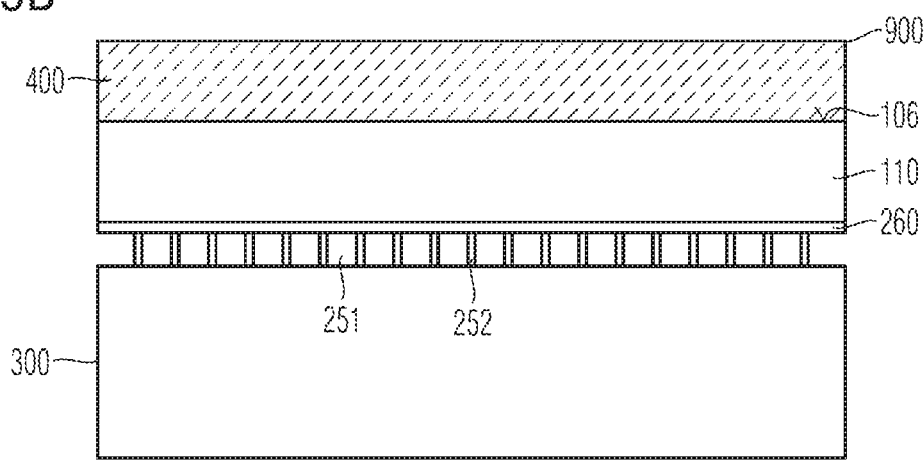
FIG. 9B shows a schematic vertical cross section through the wafer composite according to FIG. 9A after the opening of a support ring.
Figure 9C:
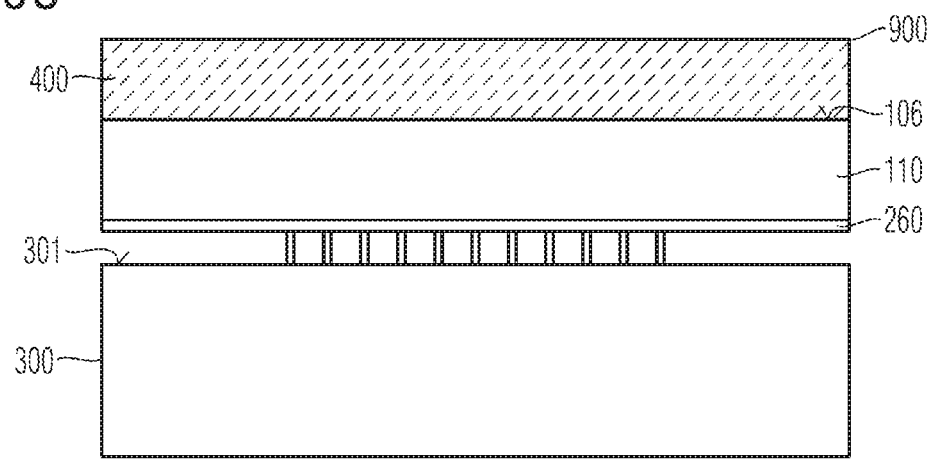
FIG. 9C shows a schematic vertical cross section through the wafer composite according to FIG. 9B while parts of the support structure within the support ring are dissolved.

FIGS. 9A to 9C relate to details of the destruction of the separation layer 250 according to one embodiment, in which the destruction of the separation layer 250 comprises chemical etching.

FIG. 9A shows a wafer composite 900 with a component layer 110 connected to an auxiliary substrate 300 via an auxiliary layer 260 and a separation layer 250, wherein an auxiliary carrier 400 can be fastened to a front side 106 of the component layer 110. The separation layer 250 comprises a support structure 252 and gas-filled chambers 251 between elements of the support structure 252.

The support structure 252 comprises a support ring 2521, which extends along the outer edge of the wafer composite 900 and which can completely seal the interior of the separation layer 250 from the outside. Within the support ring 2521, the chambers 251 are connected by lateral voids between elements of the support structure 252.

The support ring 2521 is opened at least at points or completely removed, for example by way of a local heat influx, for example by means of a laser, by way of the action of a mechanical force, for example by local polishing of the wafer composite 900 in the region of the separation layer 250, by mechanical scoring or cutting or by etching, for example by dry etching or wet etching. Opening or removing the support ring 2521 can be implemented prior to or after the attachment of the auxiliary carrier 400.

FIG. 9B shows the wafer composite 900 after the at least partial removal of the outer support ring 2521. After the removal of the support ring 2521, the chambers 251 communicate not only with one another but also with the surroundings outside of the wafer composite 900. During the further process, the support structure 252 is removed or destroyed in a way which exploits the presence of the chambers 251.

By way of example, an etching means, e.g., an etching solution, can be introduced into the chambers 251, said etching means being able to dissolve the elements of the support structure 252 within a comparatively short time. According to another embodiment, a liquid, in particular water, is introduced into the chambers 251 and the liquid is cooled to below freezing such that the auxiliary substrate 300 detaches from the remainder of the wafer composite 900 as a result of shattering due to frost. As an alternative or in addition thereto, the support structure 252 can also be destroyed by a cyclical change in pressure or by the action of moderate mechanical forces, wherein the support structure 252 can also be exposed to ultrasound.

FIG. 9C shows a decomposition advancing, from the outside to the inside, of the support structure 252 in a wet chemical process, for example based on an etching solution containing HF.

Figure 10A:
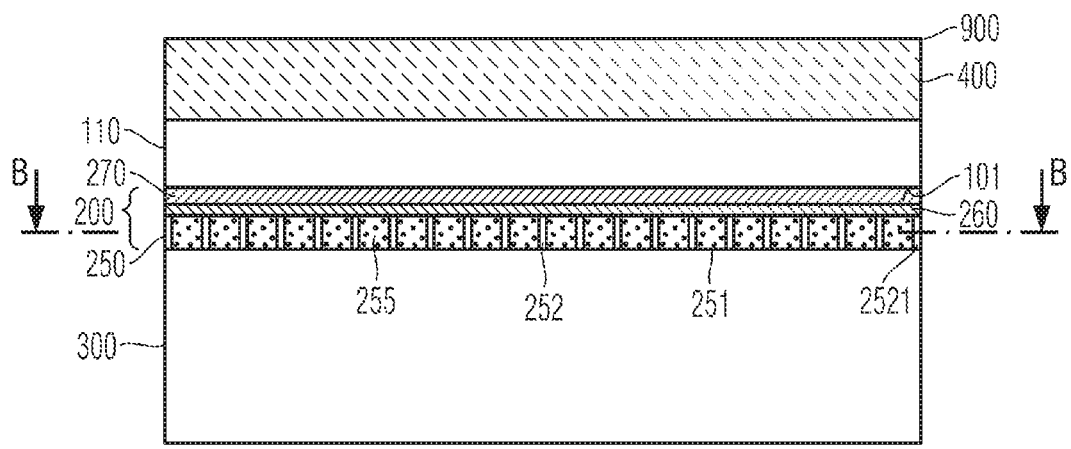
FIG. 10A shows a schematic vertical cross section through a wafer composite with a separation layer having a support structure and chambers according to a further exemplary embodiment.
Figure 10B:
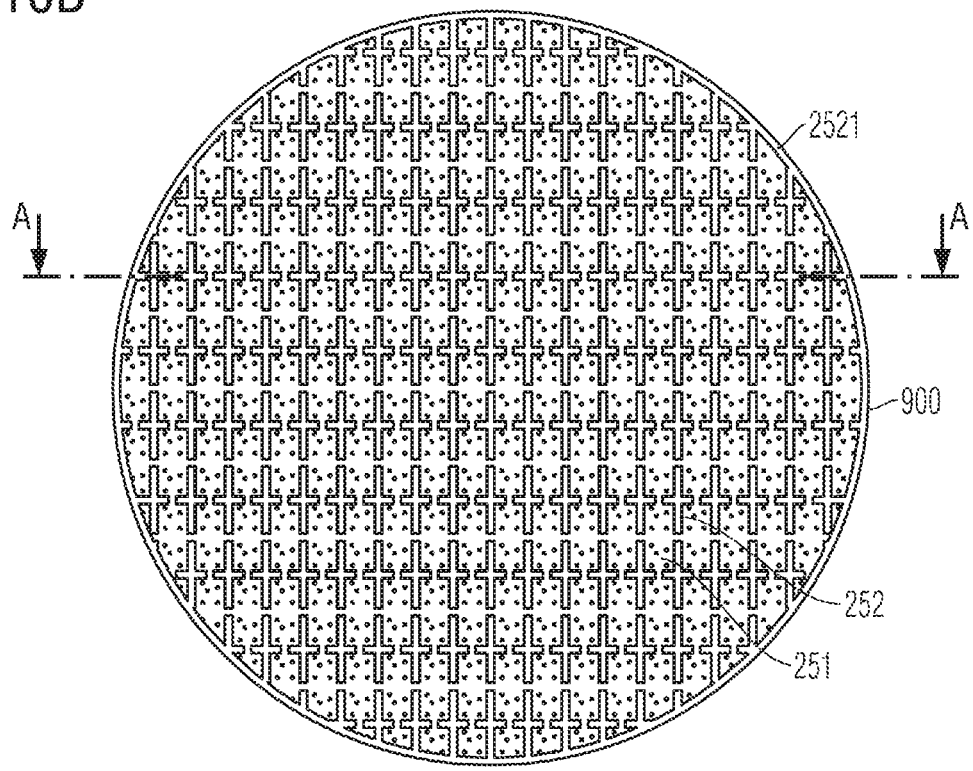
FIG. 10B shows a schematic horizontal cross section through the wafer composite according to FIG. 10A along the cut line B-B in the plane of the separation layer.

FIGS. 10A and 10B show a wafer composite 900, which comprises a donor substrate 100 made of a first crystalline semiconductor material and an auxiliary substrate 300 made of a second crystalline semiconductor material, which is made of the same elements as the first crystalline material. The first and the second semiconductor material can be identical or can differ from one another at least by way of a doping, a crystal type, a polytype or by the existence or absence of grain boundaries. The wafer composite 900 moreover comprises a layer structure 200 with a separation layer 250, which layer structure connects the auxiliary substrate 300 to the donor substrate 100.

The wafer composite 900 can be used in one of the methods described here and/or can be producible using one of the methods described here. That is to say, all features disclosed in relation to the method are also disclosed in relation to the wafer composite 900, and vice versa.

The separation layer 250 comprises a support structure 252 and chambers 251 between elements of the support structure 252, which chambers can be empty or which chambers are filled at least predominantly by means of sacrificial material that differs from the material of the support structure 252. In addition to the separation layer 250, the layer structure 200 can have yet further layers, e.g., an auxiliary layer 260 and/or a metallization layer 270.

The support structure 252 can have a support ring 2521, which extends along the outer edge of the wafer composite 900 and which can completely seal the interior of the separation layer 250 from the outside. A vertical extent of the support structure 252 can lie in the range between 50 nm and 50 µm, for example in a range from 5 µm to 20 µm.

The material of the support structure 252 can be thermally stable up to 1700° C., for example in conjunction with a donor substrate 100 on the basis of SiC, or up to 1200° C. in conjunction with a donor substrate 100 on the basis of Si, Ge, SiGe, GaN, GaAs, with the support structure 252 neither melting nor decomposing below the respectively specified temperature. The elements of the support structure 252 within the support ring 2521 can be regularly arranged column-like elements, wherein a horizontal length of the elements does not exceed a horizontal width by more than a factor of ten.

According to the exemplary embodiment of FIG. 10B, the support structure 252 has regularly arranged elements, the horizontal cross section of which is cross-shaped, wherein each chamber 251 is connected to four adjacent chambers 251 by voids between adjacent elements of the support structure 252. According to other embodiments, some of the voids shown in FIG. 10B can be missing such that a labyrinthine support structure 252 arises, in which at least some of the chambers 251 are connected to fewer than four adjacent chambers 251.

Figure 11A:
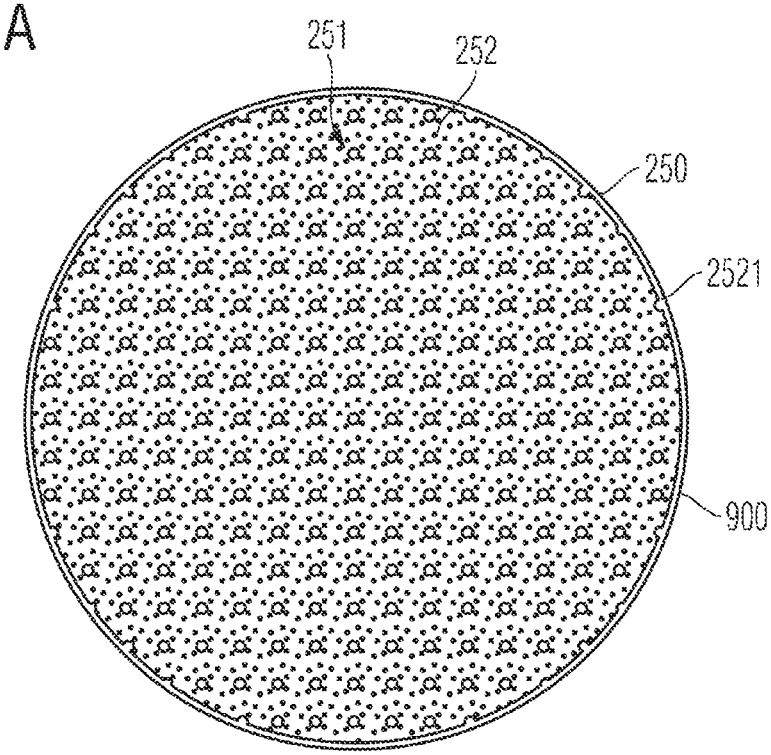
FIG. 11A shows a schematic horizontal cross section through a wafer composite in the plane of a separation layer with a support structure according to a further exemplary embodiment.

FIG. 11A shows a support structure 252 which has a multiplicity of mutually separated, regularly arranged column-like elements in addition to an outer continuous support ring 2521. A horizontal cross-sectional area of the column-like elements can be a polygon, for example a rectangle with or without rounded or chamfered corners, an ellipse, an oval or a circle. The horizontal cross-sectional area of the column-like elements of the support structure 252 can lie in a range from 400 nm$^2$ to 9 µm$^2$, for example in a range from 600 nm$^2$ to 2 µm$^2$.

Figure 11B:
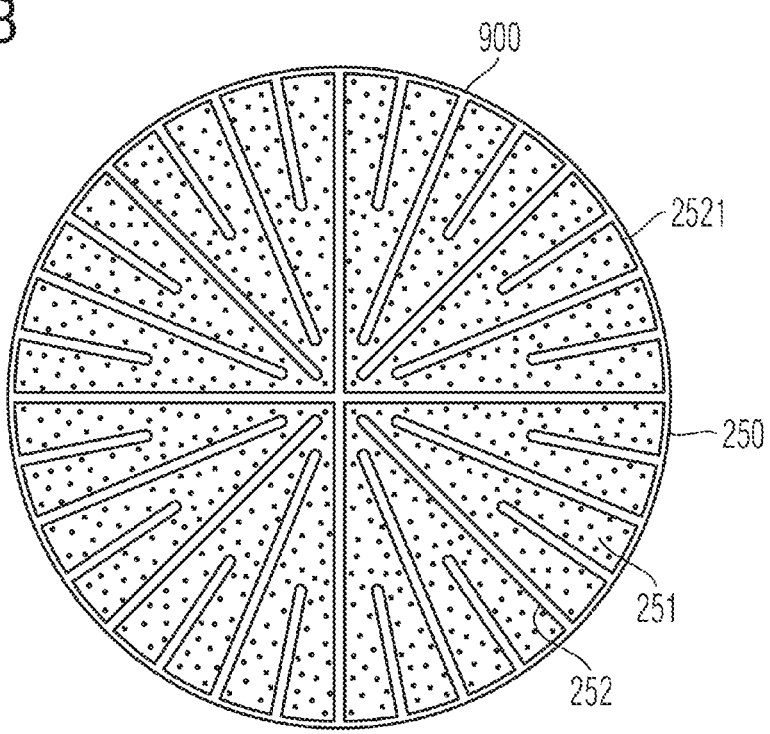
FIG. 11B shows a schematic horizontal cross section through a wafer composite in the plane of a separation layer with a support structure according to a further embodiment.

According to FIG. 11B, the support structure 252 comprises ribs in addition to the support ring 2521, said ribs having longitudinal axes that are aligned radially to the horizontal center of the wafer composite 900 and forming chambers 251 with a wedge-shaped cross section therebetween. A horizontal cross-sectional area of the ribs can be more than 10 µm$^2$.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A method for producing a semiconductor component, including:
   providing a wafer composite comprising a donor substrate, an auxiliary substrate and a separation layer arranged between the auxiliary substrate and the donor substrate, the separation layer having a support structure and sacrificial material, which is formed laterally between elements of the support structure;

separating the auxiliary substrate from the donor substrate, including a selective removal of the sacrificial material in relation to the support structure.

2. The method of claim 1, wherein providing the wafer composite comprises:
forming the separation layer on the donor substrate or on the auxiliary substrate;
connecting the auxiliary substrate to the donor substrate such that the separation layer is arranged between the auxiliary substrate and the donor substrate.

3. The method of claim 2, wherein forming the separation layer comprises:
forming elements of the support structure; and
filling chambers formed between the elements of the support structure with the sacrificial material.

4. The method of claim 1, wherein functional elements of the semiconductor component are formed in a component layer prior to separation, and wherein the component layer comprises the donor substrate or a seed layer that was split from the donor substrate and an epitaxial layer grown on the seed layer.

5. The method of claim 1, wherein the support structure comprises silicon nitride, silicon oxide, aluminum oxide and/or silicon.

6. The method of claim 1, further including:
splitting the donor substrate along a splitting plane parallel to the separation layer into a seed layer and a main part, wherein, post splitting, the seed layer of the donor substrate is connected to the auxiliary substrate and the main part of the donor substrate is detached from the seed layer.

7. The method of claim 6, wherein a defect layer is formed in the donor substrate by implanting light ions and the splitting is implemented along the defect layer.

8. The method of claim 6, wherein vertical openings that reach as far as the separation layer are formed in the seed layer.

9. The method of claim 6, further including:
growing an epitaxial layer on the seed layer.

10. The method of claim 9, wherein deep openings are formed, the deep openings reaching through the epitaxial layer and the seed layer into the separation layer, and wherein the sacrificial material and/or breakdown products of the sacrificial material is/are removed through the deep openings.

11. The method of claim 1, wherein vertical auxiliary openings that reach up to the separation layer are formed in the auxiliary substrate and the sacrificial material and/or breakdown products of the sacrificial material is/are removed through the vertical auxiliary openings.

12. The method of claim 1, wherein removing the sacrificial material comprises a thermal decomposition of the sacrificial material.

13. The method of claim 1, wherein removing the sacrificial material comprises a chemical decomposition or chemical dissolution of the sacrificial material.

14. The method of claim 1, wherein the support structure has a support ring along an outer edge of the separation layer and the separation includes an opening of the support ring.

15. The method of claim 1, wherein separating the auxiliary substrate from the donor substrate comprises:
introducing a liquid between the elements of the support structure; and
after introducing the liquid, freezing the liquid.

16. The method of claim 1, wherein separating the auxiliary substrate from the donor substrate comprises:
introducing an etching medium between the elements of the support structure.

17. The method of claim 16, wherein the etching medium is an acid that dissolves a material of the support structure.

18. The method of claim 1, wherein the support structure is applied to the donor substrate.

19. The method of claim 1, wherein the support structure is applied to the auxiliary substrate.

20. The method of claim 1, further comprising:
applying an auxiliary layer on the separation layer; and
subsequently connecting the auxiliary substrate to the donor substrate.

21. The method of claim 1, further comprising:
applying a metallization layer over a separation layer formed on the auxiliary substrate; and
subsequently connecting the auxiliary substrate to the donor substrate.

22. The method of claim 1, wherein the donor substrate and the auxiliary substrate comprise the same semiconductor material.

23. The method of claim 1, wherein the donor substrate comprises a first crystalline semiconductor material and the auxiliary substrate comprises a second crystalline semiconductor material, wherein the second crystalline semiconductor material has the same elements as the first crystalline semiconductor material, wherein the first and the second semiconductor material differ from one another by way of at least one of: doping, crystal type, polytype or the presence and/or absence of grain boundaries.

24. A wafer composite, comprising:
a donor substrate;
an auxiliary substrate; and
a separation layer connecting the auxiliary substrate to the donor substrate, the separation layer having a support structure and sacrificial material which is formed laterally between elements of the support structure.

25. The wafer composite of claim 24, wherein a first crystalline semiconductor material of the donor substrate and a second crystalline semiconductor material of the auxiliary substrate differ from one another by way of at least one of: doping, crystal type, polytype and/or the presence or absence of grain boundaries.

26. The wafer composite of claim 25, wherein the first crystalline semiconductor material and the second crystalline semiconductor material are formed with the same elements.

27. The wafer composite of claim 24, wherein the support structure has a support ring along an outer edge of the separation layer.

28. The wafer composite of claim 24, wherein a gas or a gas mixture is further situated between the elements of the support structure.

* * * * *